US011512390B2

(12) United States Patent
Landi et al.

(10) Patent No.: US 11,512,390 B2
(45) Date of Patent: Nov. 29, 2022

(54) METHOD OF SITE-SPECIFIC DEPOSITION ONTO A FREE-STANDING CARBON ARTICLE

(71) Applicants: Rochester Institute of Technology, Rochester, NY (US); The Government of the United States of America, as represented by the Secretary of the Navy, Arlington, VA (US)

(72) Inventors: Brian J. Landi, Rochester, NY (US); Cory D. Cress, Springfield, VA (US); Anthony P. Leggiero, Fairport, NY (US)

(73) Assignees: Rochester Institute of Technology, Rochester, NY (US); The Government of the United States of America, as represented by the Secretary of the Navy

( * ) Notice: Subject to any disclaimer, the term of this patent is extended or adjusted under 35 U.S.C. 154(b) by 264 days.

(21) Appl. No.: 16/513,233

(22) Filed: Jul. 16, 2019

(65) Prior Publication Data
US 2020/0017959 A1    Jan. 16, 2020

Related U.S. Application Data

(60) Provisional application No. 62/698,321, filed on Jul. 16, 2018.

(51) Int. Cl.
*C23C 16/02* (2006.01)
*C23C 16/06* (2006.01)
(Continued)

(52) U.S. Cl.
CPC .......... *C23C 16/0209* (2013.01); *C23C 16/01* (2013.01); *C23C 16/04* (2013.01);
(Continued)

(58) Field of Classification Search
CPC ..... C23C 16/0209; C23C 16/04; C23C 16/01; C23C 16/06; C23C 16/481; C23C 16/24;
(Continued)

(56) References Cited

U.S. PATENT DOCUMENTS 7,288,870 B2    10/2007 Mitcham et al.
9,214,420 B2    12/2015 Raravikar et al.
(Continued)

FOREIGN PATENT DOCUMENTS

WO    2018115645    6/2018

OTHER PUBLICATIONS

Xie, Sn@CNT nanopillars grown perpendicularly on carbon paper: A novel free-standing anode for sodium ion batteries, Feb. 2015, Nano Energy, vol. 13, p. 1-10 (Year: 2015).*
(Continued)

*Primary Examiner* — Dah-Wei D. Yuan
*Assistant Examiner* — Nga Leung V Law
(74) *Attorney, Agent, or Firm* — Bond Schoeneck & King, PLLC; Joseph M. Noto

(57) ABSTRACT

The system and method includes the suspension of a free-standing carbon article within a reaction chamber, the introduction of the chemical precursor in a reaction environment within the chamber, and heating of the carbon article in the presence of the chemical precursor leading to deposition in a site-specific manner.

18 Claims, 17 Drawing Sheets

(51) Int. Cl.
C23C 16/503 (2006.01)
C23C 16/04 (2006.01)
C23C 16/01 (2006.01)
C23C 16/48 (2006.01)
C23C 16/24 (2006.01)

(52) U.S. Cl.
CPC .............. *C23C 16/06* (2013.01); *C23C 16/24* (2013.01); *C23C 16/481* (2013.01); *C23C 16/503* (2013.01)

(58) Field of Classification Search
CPC ....... C23C 16/503; C23C 16/46; C23C 16/56; C23C 16/18; C23C 16/4418
See application file for complete search history.

(56) References Cited

U.S. PATENT DOCUMENTS

| | | | |
|---|---|---|---|
| 10,017,389 | B2 | 7/2018 | Hata et al. |
| 2007/0036978 | A1 | 2/2007 | Chen |
| 2008/0254362 | A1* | 10/2008 | Raffaelle ................ H01G 11/42 429/188 |
| 2009/0277793 | A1 | 11/2009 | Ehira et al. |
| 2010/0052223 | A1 | 3/2010 | Kim et al. |
| 2011/0008617 | A1 | 1/2011 | Hata et al. |
| 2011/0052805 | A1 | 3/2011 | Bordere et al. |
| 2012/0121986 | A1 | 5/2012 | Balu et al. |
| 2012/0164429 | A1 | 6/2012 | Shah et al. |
| 2012/0177926 | A1 | 7/2012 | Mann et al. |
| 2012/0244033 | A1 | 9/2012 | Shugart et al. |
| 2013/0243974 | A1 | 9/2013 | Seung-Il et al. |
| 2014/0271344 | A1 | 9/2014 | Kessler et al. |
| 2016/0057544 | A1 | 2/2016 | Chamarthy |
| 2017/0014908 | A1 | 1/2017 | Shaojiu et al. |
| 2017/0190579 | A1 | 7/2017 | Cola et al. |
| 2017/0298476 | A1 | 10/2017 | Braydich et al. |
| 2018/0073110 | A1 | 3/2018 | Balachandran et al. |
| 2018/0102200 | A1 | 4/2018 | Wu |
| 2018/0186955 | A1 | 7/2018 | Odeh et al. |
| 2018/0126456 | A1 | 10/2018 | So et al. |
| 2018/0358618 | A1* | 12/2018 | Tour ....................... H01M 4/661 |

OTHER PUBLICATIONS

Do, Nanosoldering Carbon Nanotube Junctions by Local Chemical Vapor Deposition for Improved Device Performance, 2013, Nao Letters, vol. 13, p. 5844-5850 (Year: 2013).*

Do, JW., et al., "Nanosoldering Carbon Nanotube Junctions by Local Chemical Vapor Deposition for Improved Device Performance", Nano Letters, Nov. 11, 2013, pp. 5844-5850, vol. 13, American Chemical Society Publications.

Xie, X., et al., "Sn@CNT nonopillars grown perpendicularly on carbon paper: A novel free-standing anode for sodium ion batteries", Nano Energy, Feb. 14, 2015, pp. 1-10, vol. 13, http://dx.doi.org/10.1016/j.nanoen.2015.02.022.

Sundaram, R., et al., "Electrical performance of lightweight CNT-Cu composite wires impacted by surface and internal Cu spatial distribution", Scientific Report, Aug. 24, 2017, pp. 1-11, vol. 7, https://www.nature.com/articles/s41598-017-09279-x.

Janas, D., et al., "The influence of metal nanoparticles on electrical properties of carbon nanotubes", Applied Surface Science, Jul. 15, 2016, pp. 74-78, vol. 376, https://doi.org/10.1016/j.apsusc.2016.02.233.

Devi, A., et al., "A novel Cu(II) chemical vapor deposion precursor: Synthesis,characterization, and chemical vapor deposition", Journal of Materials Research, 1998, pp. 687-692, vol. 13, https://doi.org/10.1557/JMR.1998.0086.

Milowska, M., et al., "Breaking the Electrical Barrier between Copper and Carbon Nanotubes", Nanoscale, 2017, pp. 8458-8469, vol. 9, 10.1039/C7NR02142A.

Subramaniam, T., et al., "One hundred fold increase in current carrying capacity in a carbon nanotube-copper composite" Nature Communications, 2013, pp. 1-7, vol. 4, 10.1038/ncomms3202 (2013).

Zou, D., et al., "Ni Nanobuffer Layer Provides Light-Weight CNT/Cu Fibers with Superior Robustness, Conductivity, and Ampacity" ACS Appl. Mater Interfaces, 2018, pp. 8197-8204, vol. 10, https://doi.org/10.1021/acsami.7b19012.

Han, B., et al., "Fabrication and densification of high performance carbon nanotube/copper composite fibers", Carbon N.Y., 2017, pp. 593-604, vol. 123, https://doi.org/10.1016/j.carbon.2017.08.004.

Hannula, P.M., et al., "Carbon nanotube-copper composites by electrodeposition on carbon nanotube fibers", Carbon N.Y., 2016, pp. 281-287, vol. 107, 10.1016/j.carbon.2016.06.008.

Di, J., et al., "Strong, Twist-Stable Carbon Nanotube Yarns and Muscles by Tension Annealing at Extreme Temperatures", Advanced Materials, May 17, 2016, pp. 238-247, vol. 143, https://doi.org/10.1002/adma.201600628.

Han, B., et al., "Enhancement of the twisted carbon nanotube fibers properties by drawing processing and acid treatment", Carbon N.Y., Apr. 4, 2018, pp. 238-247. vol. 143, https://doi.org/10.1016/j.matdes.2018.02.004.

Wang, J.N., et al., "High-strength carbon nanotube fibre-like ribbon with high ductility and high electrical conductivity", Nature Communications, Jun. 25, 2014, pp. 1-8, vol. 143, 10.1038/ncomms4848.

Lekawa-Raus, A., et al., "Electrical Properties of Carbon Nanotube Based Fibers and Their Future Use in Electrical Wiring", Advanced Functional Materials, 2014, pp. 3661-3682, vol. 24, 10.1002/adfm.201303716.

Xu, G., et al., "Continuous electrodeposition for lightweight, highly conducting and strong carbon nanotube-copper composite fibers", Nanoscale, 2011, pp. 4215-4219, vol. 3, 10.1039/c1nr10571j.

Do, J.W., et al., "Solution-Mediated Selective Nanosoldering of Carbon Nanotube Junctions for Improved Device Performance", ACS Nano, Apr. 6, 2015, pp. 4806-4813, vol. 9, https://doi.org/10.1021/nn505552d.

Internal Search Report and Written Opinion for International Application No. PCT/US2019/42028 dated Sep. 27, 2019, 9 pages.

* cited by examiner

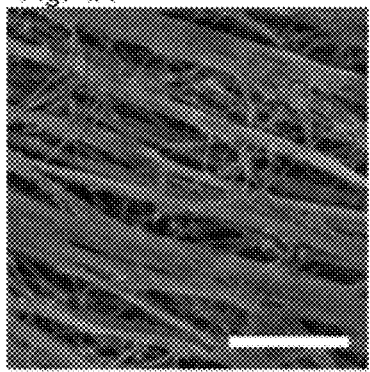
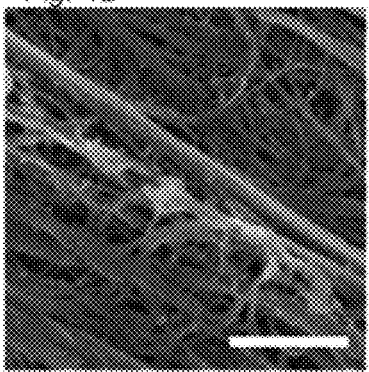
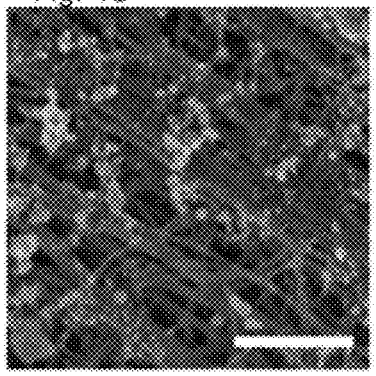
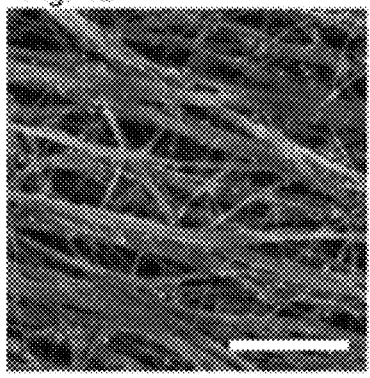
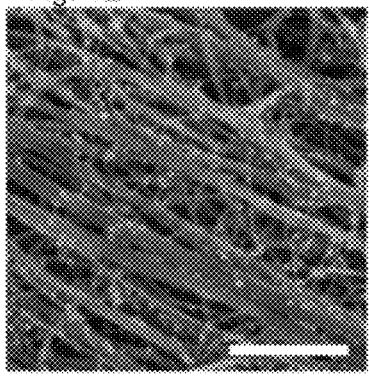
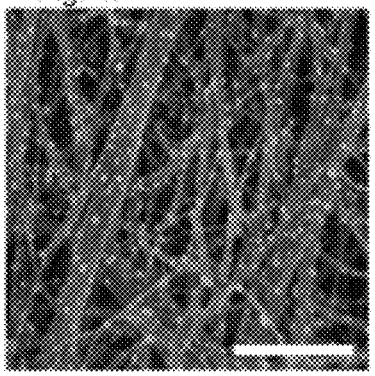

Fig. 5A 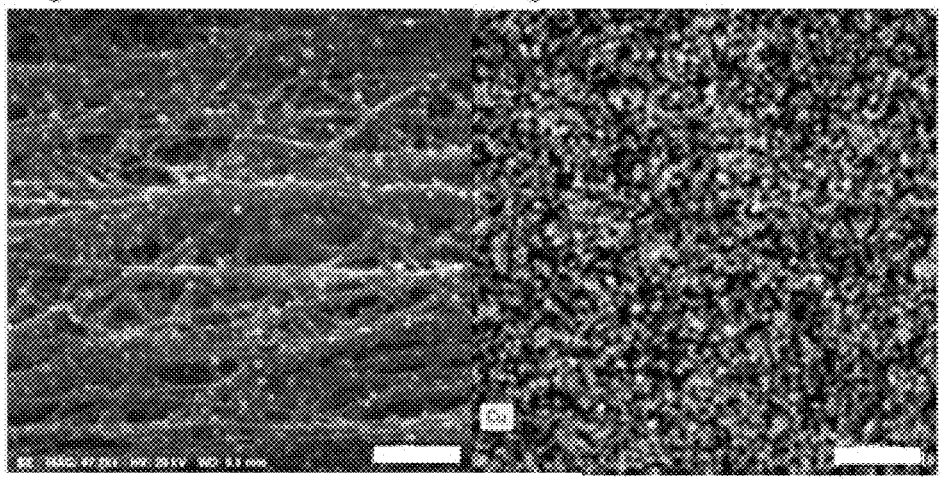 Fig. 5B
Fig. 5C 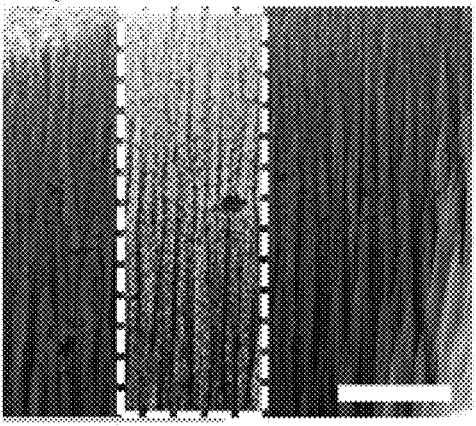 Fig. 5D 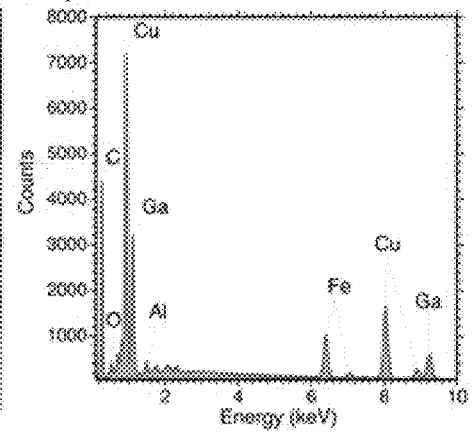

1 cm

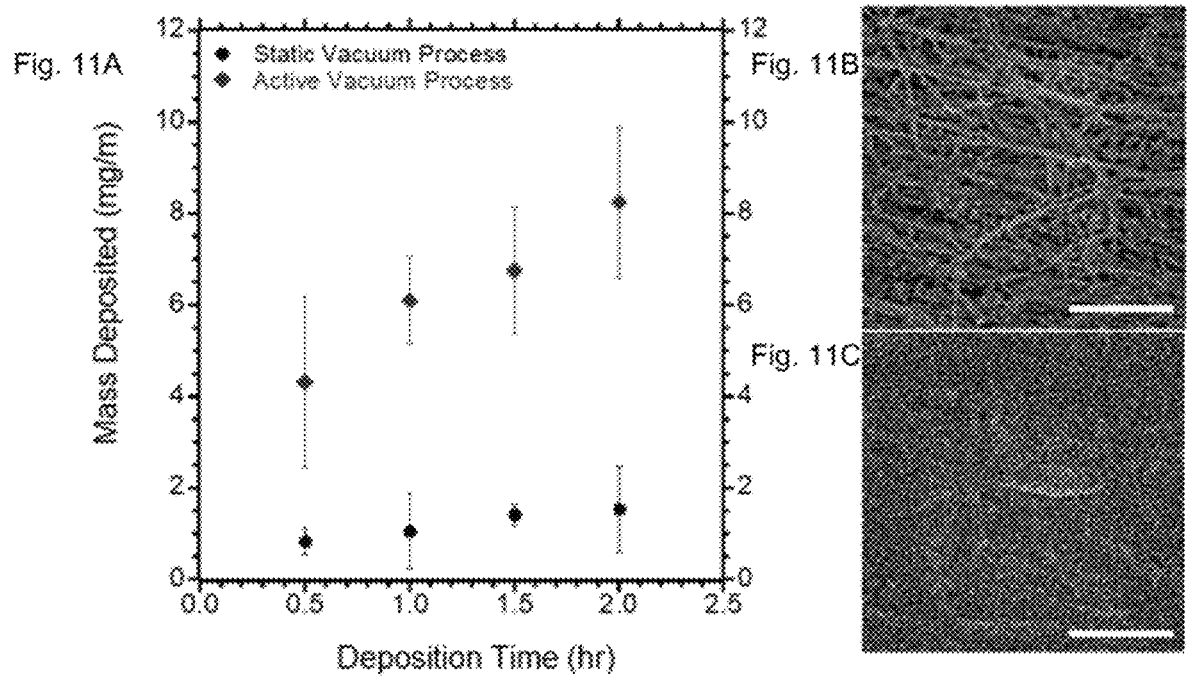

Fig. 13A
Fig. 13B
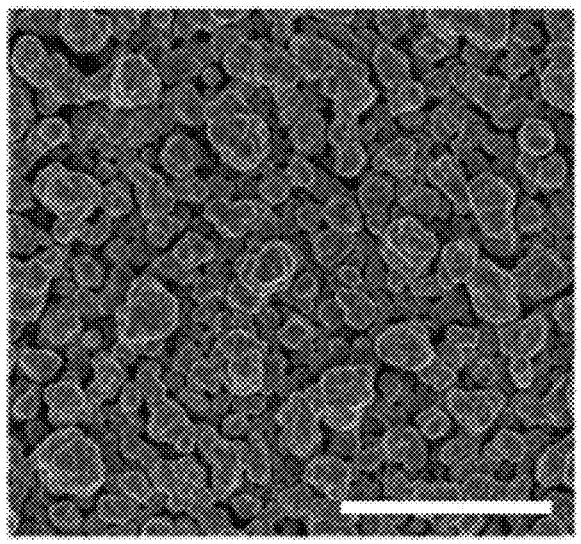
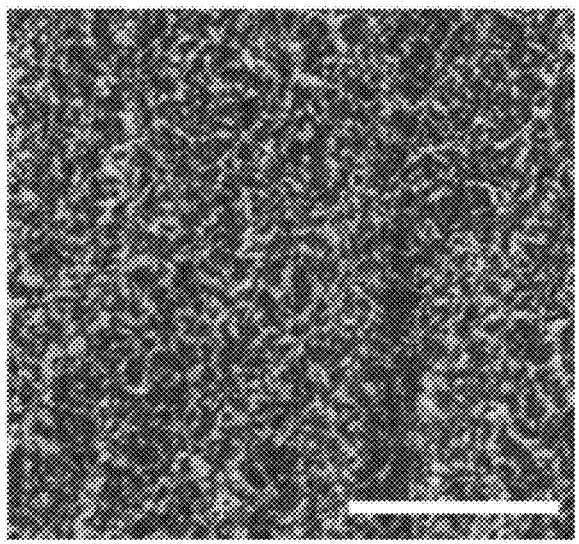

METHOD OF SITE-SPECIFIC DEPOSITION ONTO A FREE-STANDING CARBON ARTICLE

CROSS REFERENCE

This application claims the benefit of the filing date of U.S. Provisional Patent Application Ser. No. 62/698,321, filed Jul. 16, 2018, which is hereby incorporated by reference in its entirety.

FIELD

The present application relates to a deposition system and method, and in particular to a system and method to fabricate a bulk material-carbon composite conductor via site-specific deposition.

BACKGROUND

Carbon nanotubes have held great theoretical promise as conductors due to a combination of high conductivity, great flexure tolerance, incredible tensile strength, and a low temperature coefficient of resistance. However, while much research has been done investigating these properties in nanoscale applications, such as in integrated circuits, there has been much difficulty in translating these properties into bulk structures. Unlike conventional bulk conductors such as copper and aluminum whose structures are held together through metallic bonds, bundles of carbon nanotubes wire are held together through relatively weaker van der Waals forces. This creates a unique challenge in the production of bulk wires. Thus, much research has been devoted towards limiting the amount of empty space and resistive junctions in as-produced wires. However, even the best as-produced wires tend to fall far short of their theoretical maximum conductivities.

Various techniques such as ionic doping, densification, heat treatments, and the introduction of bridging defects have been employed to lower the resistance within the micro- and nanostructure structure of a CNT wire. One recent trend has been to develop CNT-metal hybrids which attempt to combine the advantages of these two materials into one composite. Efforts to produce hybrid conductors have typically focused on electrodeposition and physical vapor deposition methods.

Despite all of the techniques employed to improve the conductivity of pure CNT wires, they still fall short of their theoretical conductivity. Ionic doping may not be stable at elevated temperature. Densifications and heat treatments have only limited effect on conductivity. The introduction of defects may have detrimental effects on the electrical transport efficiency of individual CNTs. While high-quality coatings can be produced through both electrodeposition and physical vapor deposition, they share a disadvantage in that the depositions are not site-specific. They tend to deposit metal to all locations across the CNT surface equally.

Prior work with chemical vapor deposition has been limited to nanoscale assemblies of a few individual CNTs and not realized at the bulk scale for meaningful conductors. The CVD seeding approach saves considerable time where the process timescale for CVD seeding can be seconds to minutes rather than hours for previously reported electroplating seed procedures.

Chemical vapor deposition has been relatively unexplored in the realm of bulk CNT conductors, and is used in lieu of the other more well-established techniques. The use of Joule heating to selectively deposit the precursor has so far only been demonstrated towards nanoscale devices.

SUMMARY

In accordance with one aspect of the present disclosure, there is provided a method for site-specific deposition, including: providing a free-standing carbon article; providing a chemical precursor; applying energy to the free-standing carbon article; and thermally decomposing the chemical precursor to deposit material at site-specific locations on the free-standing carbon article.

In accordance with another aspect of the present disclosure, there is provided bulk nanostructured carbon conductor produced by the present method.

These and other aspects of the present disclosure will become apparent upon a review of the following detailed description and the claims appended thereto.

BRIEF DESCRIPTION OF THE DRAWINGS

FIG. 4A is an electron microscopy image of the as-received carbon nanotube roving, FIG. 4B is an image of the roving after the condensation of the chemical precursor with no heating current, FIG. 4C is an image of the roving with partially reacted precursor with a heating current, FIG. 4D is an image of the roving with nanoparticles deposited from chemical precursor with a heating current, FIG. 4E is an image of the roving with nanoparticles deposited from chemical precursor with a heating current, and FIG. 4F is an image of the roving with nanoparticles deposited from chemical precursor with a heating current;

FIG. 5A is an electron microscopy EDX imaging of a 400 mA CFH-CVD sample, FIG. 5B is an EDX spatial map of copper signal intensity of the region in FIG. 5A, FIG. 5C is an EDX spatial map of copper signal of a FIB milled cross section of the sample in the box bounded by the white dotted line, and FIG. 5D is a histogram of signal frequency counts from the analyzed region of FIG. 5C;

FIG. 11A is a plot of deposited mass (as linear density) comparing the active and static vacuum techniques, FIG. 11B is a secondary electron image of a one-hour active vacuum deposition, and FIG. 11C is a secondary electron image of a two-hour active vacuum deposition;

FIG. 13A is an electron micrograph image showing the particles deposited from a run with continuously applied current and FIG. 13B is an electron image showing the particles deposited from a run with current applied towards the end of the run;

DETAILED DESCRIPTION

Figure 1:
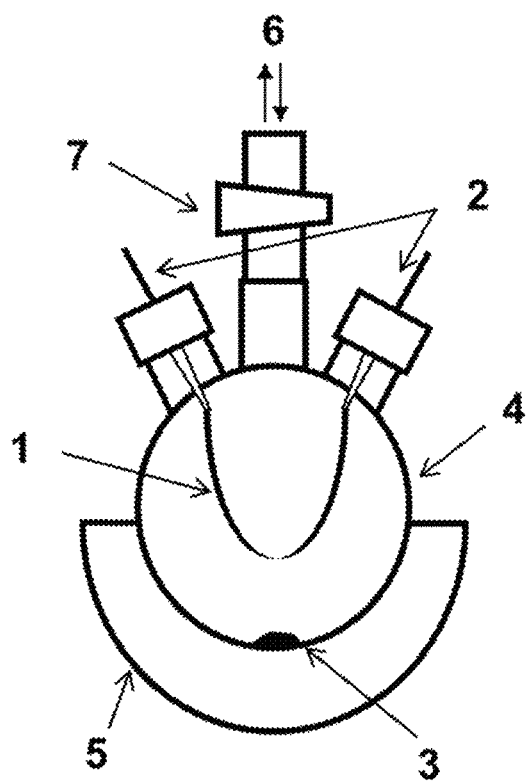
FIG. 1 is a schematic of a setup used to carry out the vapor deposition on an individual batch scale in accordance with an embodiment of the present disclosure.

The method utilizes site-specific chemical vapor deposition (CVD) via localized differences in temperature to thermally decompose chemical precursor(s) to deposit material onto bulk nanocarbon conductors (e.g., carbon nanotube, graphene, etc.). The material can be deposited as nanoparticles or coatings. In one embodiment, the selected material can deposit and create a three-dimensional hybrid network with the material weight loadings up to and >99% w/w. In another embodiment, the CVD deposited material can serve as an adhesion material for a subsequent overcoat of a dissimilar conducting material which would be the case for an adhesion material such as titanium, palladium or platinum being deposited prior to overcoat from a material such as copper, aluminum, or nickel. The overcoating process can include approaches like CVD, physical vapor deposition, electroless deposition, and electroplating. In another embodiment, the deposited material is a seed material for overcoat deposition from the same material which would be the case for nickel nanometal seeds prior to nickel overcoat, copper nanometal seeds prior to copper overcoat, etc. Another embodiment uses multiple CVD depositions simultaneously and/or sequentially to create layered and potential alloy-type structures depending on selected materials and processing to improve the material seeding. The method provides site specificity which derives from differences in material resistance to produce high conductivity metal-carbon composite conductors. Prior to the deposition optical, electrical or magnetic properties of the article can be modified to provide site-specific locations in the article. The CVD-produced seeds are uniquely deposited in localized regions due to the temperature differences (from the localized resistance) which process is in contrast to previous electroplating work where seed deposition is non-specific. In addition, the process timescale for CVD seeding can be seconds to minutes rather than hours for previous electroplating seed procedures. A composite or hybrid article can be prepared by post-processing of the article through annealing, densification, electrodeposition, and combinations thereof.

Alternatively, the CVD method has the potential to deposit copper throughout the CNT network while specifically targeting areas of higher resistance, this could provide a method to greatly improve the utilization of deposited copper. The improved overcoat result from electroplating CVD seeded was not available in the field as an effective utilization of metal mass.

The CVD method utilizes the Joule heating of a carbon conductor to decompose a metalorganic precursor, depositing metal particles onto and throughout the carbon conductor (with a preferred embodiment using carbon nanotube (CNT) conductors). The system includes a freestanding carbon article, a mechanism to induce heating in the carbon article, a chemical precursor, and a reaction chamber to contain the setup with appropriate inlets and outlets.

The carbon article is a bulk structure composed of nanostructured carbon materials such as carbon nanotubes, graphene, carbon fibers, or some combination of these materials. The carbon nanotubes may be single-wall, double-walled, multi-walled, or some combination of those types. In an embodiment, the free-standing carbon article is composed of single wall carbon nanotubes, multi-walled carbon nanotubes, carbon fibers, carbon whiskers, graphite, graphene, graphene oxide, and combinations thereof. The graphene may be single-layer, multi-layered, or some combination of those types. The bulk carbon structure has at least one dimension in excess of 1 cm. The bulk carbon structure is freestanding, i.e., it does not require a substrate and will not break apart into multiple pieces within the environment of the reaction chamber. The bulk carbon structure is three dimensional and may be porous. If present, the pores allow for the chemical precursor to access the interior volume of the bulk carbon structure. The bulk carbon structure may have variation of more than 10% in the electrical resistivity in any direction, but particularly along the direction with the dimension in excess of 1 cm.

The mechanism to induce heating in the carbon article may utilize direct current electrical bias, alternating current electrical bias, thermal radiation from a laser source, infrared heating, inductive heating, or conductive heating. In any case, the freestanding carbon article is in contact with electrically conductive leads. These leads may be connected to an ohmmeter, to provide measurement of the resistance of the article between the leads. In one preferred embodiment, the leads may be metallic clips which suspend the carbon article and allow for the application of electrical bias. In another preferred embodiment, the leads may be rigid electrically conductive posts, with the carbon article pressed across the leads while suspended from an additional support mechanism such as a spooling system. Where direct current or alternating current is used as the heating source, electrical current is passed through the electrical leads into the carbon article. An increase in temperature is caused through Joule heating in the carbon article. The site-specific heating increases the local temperature of the carbon article to a temperature greater than or equal to the decomposition temperature of the chemical precursor. Typically, a suitable temperature is between 100° C. and 1100° C. to cause decomposition of the chemical precursor and deposition of the material onto the article. The site-specific heating can be provided in a continuous, delayed, pulsed or combination thereof operation to modify the site-specific characteristics of the material deposition. Higher applied currents lead to increases in article heating. Control over applied current leads to control over the temperature of the carbon article. Localized areas of the carbon article with higher resistance may experience higher temperatures leading to site-specific heating. In one preferred embodiment, the degree of heating may be modified through modulation of the applied electrical current. Where thermal radiation from a laser source or infrared heating is utilized as the heat source, heating occurs through radiative transfer. Resistance measurements of the carbon article from between the electrical leads may be used as to determine the amount radiative energy to apply from the radiative heat source leading to site-specific heating. Where conductive heating is used as the heat source, a thermally conductive contact may be used to transfer heat to the carbon article. Resistance measurements of the carbon article from between the electrical leads may be used as to determine the amount heat to apply from the thermally conductive contact leading to site-specific heating. In one preferred embodiment, one or both of the electrical leads are used as the thermally conductive contact. In another preferred embodiment, a separate thermally conductive contact is present between the electrical leads. Where inductive heating is the heat source, a conductive coil may be used to induce eddy currents within the carbon article. Resistance measurements of the carbon article from between the electrical leads may be used as to determine the amount heat to apply from the thermally conductive contact leading to site-specific heating.

A suitable chemical precursor material is a compound which, upon exposure to sufficient thermal energy in an appropriate environment, decomposes into the material to be deposited onto the carbon article. The material to be deposited from the chemical precursor may be Cu, Ag, Au, Ni, Pd, Pt, Fe, Ru, Co, Rh, Ir, W, Cr, Mo, Mn, Zn, Pb, Ti, V, Zr, their respective alloys, an intermetallic compound, or a solid solution of such materials. The deposited material in the nanoparticles and coatings can include silicon, germanium, tin or alloys thereof. The chemical compound may be a metalorganic compound, inorganic hydride, a metal hydride, or a metal carbonyl. A metalorganic compound is a chemical compound composed of a metal and one or more organic ligands. A metal hydride is a chemical compound composed of a metal and one or more hydrogen centers with reducing or basic properties. A metal carbonyl is a chemical compound composed of a metal and one or more carbon monoxide ligands. An appropriate environment for decomposition of the compound may include pressure between 30 kiloPascals and 130 kiloPascals with air, Ar, He, $H_2$, $N_2$, $O_2$ $NH_3$, CO, or some combination thereof present.

A suitable reaction chamber includes a solid enclosure with allows for attainment and maintenance of the local reaction environment for the decomposition of the chemical precursor as mentioned above. The reaction chamber is sufficiently large to contain the carbon article. The reaction chamber has two or more electrical feedthroughs to allow for the measurement of the resistance of the carbon article within the reaction chamber. The reaction chamber has one or more port allowing for the attainment and maintenance of the local reaction environment. The ports may allow for modification of the pressure within the system through the use of gas cylinders at higher than atmospheric pressure, or vacuum pumps allowing for the attainment of lower than atmospheric pressure. The chamber may have a window allowing for visualization of the reactions occurring within, or for radiative heating. The chamber may have additional ports or feedthroughs to accommodate additional electrical, thermal, mechanical or environmental factors.

The method involves the suspension of the carbon article within the reaction chamber, the establishment of a preferred reaction environment within the chamber for the introduction of the chemical precursor, and the heating of the carbon article in the presence of the chemical precursor leading to metal deposition in a site-specific manner.

The carbon article may be suspended in the reaction chamber using clips, spools, or related methods. The method of suspension allows for the carbon to maintain contact with the electrically conductive leads. The mechanism and suspension of the carbon article may also be the electrically conductive contacts, or the electrical contacts may be separate from the mechanism of suspension. In a preferred embodiment using clips, the clips themselves may be the electrically conductive contacts. In a preferred embodiment using spools, separate electrical contacts may be utilized. In this embodiment, the location on the carbon article that is in contact with the electrically conductive leads may change as the carbon conductor is spooled form one spool to the next. The reaction chamber is constructed such that the spools may rotate through some external mechanism such as a crank or motor throughout the deposition process. Once the carbon nanotubes have been suspended within the reaction chamber, the reaction chamber may be sealed from the external environment to allow for the establishment of a preferred reaction environment.

The preferred reaction environment may be established within the reaction chamber through the use of vacuum pumps and compressed gasses. Various inlets and outlets on the reaction chamber are used to provide a preferred combination of gasses and pressures. In one embodiment, the chamber may be heated or cooled to produce the preferred reaction environment. This environment may remain consistent throughout the deposition process, or be modified during the deposition. The reaction environment can be controlled to remove gasses or reaction byproducts from the decomposed chemical precursor to modify the deposition.

Once the preferred reaction environment has been established, the chemical precursor may be introduced in a gaseous or vapor phase into the reaction chamber. In one embodiment, the precursor is already in the gaseous or vapor phase, and is introduced through the opening of a valve. In another embodiment, additional heat is applied to a solid precursor to induce sublimation or a liquid precursor to induce vaporization in order to produce the gaseous or vapor phase to be introduced into the reaction chamber. In this embodiment, the solid or liquid phase precursor may already be present within the reaction chamber, or may be introduced through an inlet into the reaction chamber through the use of a valve.

With the vapors present in the reaction chamber, carbon article is heated to cause the article-specific decomposition of the precursor through one of the methods mentioned herein. The heating may be applied continuously, in a pulsed or modulated manner, after some time delay, or in some combination those methods. The resistive properties of the carbon article will determine the degree of heating of the carbon article, leading to article-specific deposition.

FIG. 1 is a schematic of a preferred embodiment of a setup used to carry out the vapor deposition on an individual batch scale. The carbon article (1) is strung between two flat copper clips (2) acting as electrical leads. These electrical leads (2) allow for current to be transferred through the roving, causing heating. The chemical precursor (3) is present at the bottom of the reaction chamber (4). The use of a heating mantle (5) and a connection to gas or vacuum (6) allows for the control of the local reaction environment, producing conditions for the precursor (3) to vaporize or sublimate. A stopcock (7) on the gas connection line allows for further control over the local reaction environment within the reaction chamber (4). When the precursor (3) vapors come into contact with sufficiently hot areas of the carbon article (1), they may decompose into metal nanoparticles or coating.

Figure 2A:
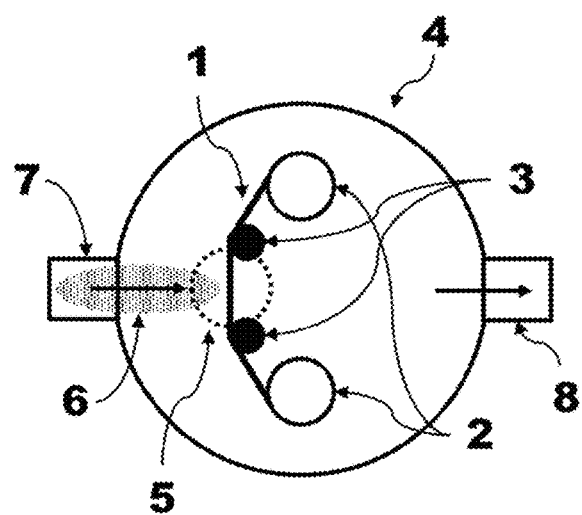
FIG. 2A is a top view schematic of a setup used to carry out the vapor deposition on a continuous scale and FIG. 2B is a side view of the schematic shown in FIG. 2A in accordance with an embodiment of the present disclosure.
Figure 2B:
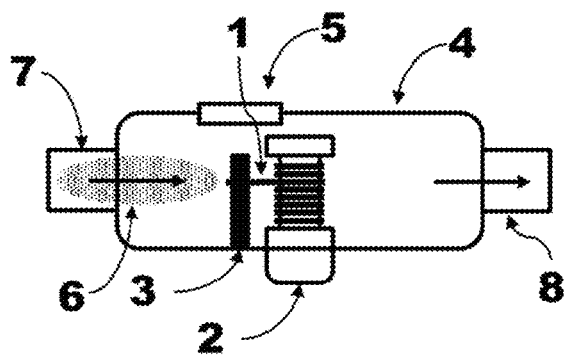

FIGS. 2A and 2B show a schematic of a preferred embodiment of a setup used to carry out the vapor deposition on a continuous scale. The carbon article (1) can be wound between two rotating spools (2) across a pair of electrical contacts (3) within the reaction chamber (4). The electrical leads (3) allow for current to be transferred through the roving, causing heating. Alternatively, the electrical leads (3) may be hooked up to an ohmmeter, and heat may be applied through radiative method such as a laser or infrared source through an optical window (5). The precursor vapor (6) enters the reaction chamber through an inlet (7), which may also supply gasses to establish or modify the local reaction environment. The inlet (7) combined with an outlet (8) hooked up to a vacuum pump, allow for control over the local reaction environment.

Figure 3:
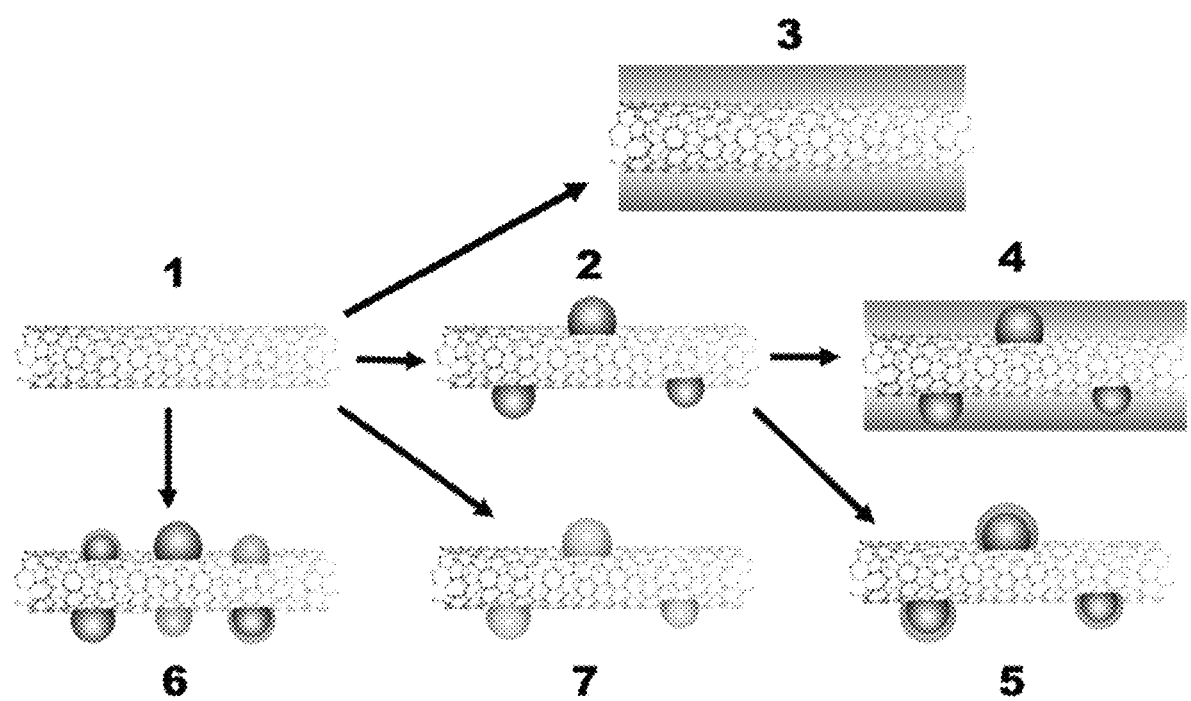
FIG. 3 is a series of schematics demonstrating various deposition sequences from the reaction of the chemical precursor onto hot locations of the carbon article.

FIG. 3 demonstrates deposition possibilities from the reaction of the chemical precursor onto hot locations of the carbon article (1). In (2), nanoparticles have been deposited from the chemical precursor. In (3), a thin coating has been deposited from the chemical precursor. The results of a deposition may be used for sequential depositions, such as a seed-overcoat structure from subsequent CVD or electroplating (4), or in the deposition or core-shell nanoparticles (5). If multiple chemical precursors are used in the initial deposition, co-deposition of particles may occur (6). Multiple chemical precursors may also lead to the deposition of alloys, intermetallic compounds, or solid solutions of metals (7).

FIGS. 4A-4F show secondary electron images magnified 60,000 time from a Hitachi S900 electron microscope. FIG. 4A is an image of the as-received carbon nanotube roving. FIG. 4B is an image of the roving after the condensation of the Cu(tBAOAC)$_2$ chemical precursor with no heating current. FIG. 4C is an image of the roving with partially reacted Cu(tBAOAC)$_2$ chemical precursor from a heating current of 100 mA. FIG. 4D is an image of the roving with nanoparticles deposited from Cu(tBAOAC)$_2$ chemical precursor from a heating current of 200 mA. FIG. 4E is an image of the roving with nanoparticles deposited from Cu(tBAOAC)$_2$ chemical precursor from a heating current of 300 mA. FIG. 4F is an image of the roving with nanoparticles deposited from Cu(tBAOAC)$_2$ chemical precursor from a heating current of 400 mA. The scale bar on each image represents a distance of 500 nm.

FIGS. 5A-5D show electron microscopy images. EDX imaging of a 400 mA CFH-CVD sample. FIG. 5A is a secondary electron image of the area magnified by 97,700×. The scale bar represents a length of 500 nm. FIG. 5B is an EDX spatial map of copper signal intensity of the region in FIG. 5A. FIG. 5C is an EDX spatial map of copper signal of a FIB milled cross section of the sample in the box bounded by the white dotted line. The scale bar represents a distance of 3 µm. The intensity of the copper signal is represented by the brightness of the image within that box. FIG. 5D is a histogram of signal frequency counts from the analyzed region of FIG. 5C, demonstrating the prominence of the copper signal.

Figure 6A:
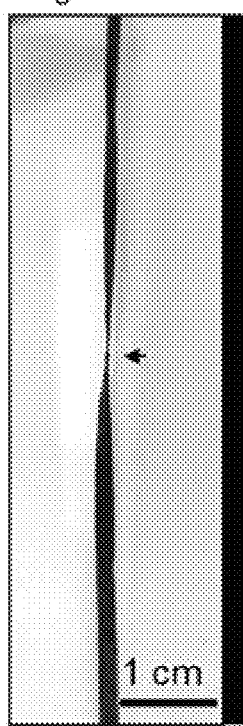
FIG. 6A demonstrates the generation of a hot spot through an intentionally created defect knot, indicated by the arrow.
Figure 6B:
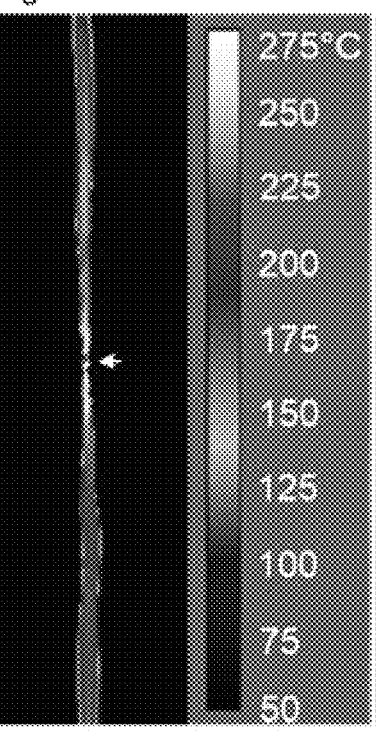
FIG. 6B is a thermal image of the knot showing a hot spot near the knot.
Figure 6C:
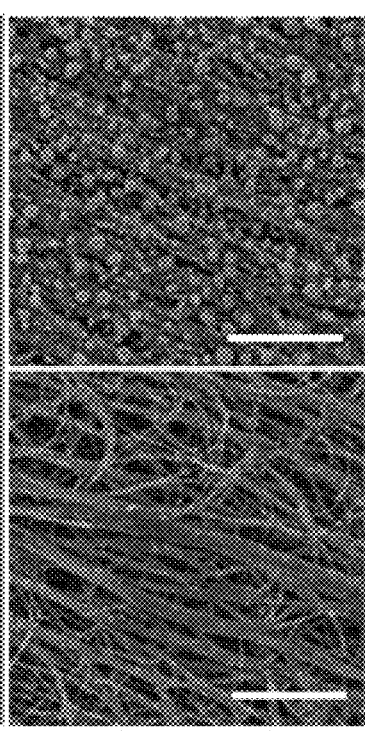
FIG. 6C is a secondary electron image after deposition from a region adjacent to the knot.
Figure 6D:
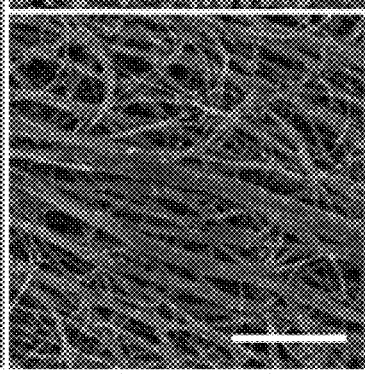
FIG. 6D is a secondary electron image after deposition from a region 1 cm away from the knot.

FIGS. 6A-6D demonstrates the generation of a hot spot through an intentionally created defect (here, a knot). FIG. 6A is an image of the knot, indicated by the arrow. FIG. 6B is a thermal image of the knot under a current 300 mA in air, showing a hot spot near the knot. FIG. 6C is a secondary electron image taken at 30,000× magnification after a 300 mA deposition from a region adjacent to the knot. The scale bar represents a distance of 1 µm. FIG. 6D is a secondary electron image taken at 30,000× magnification after a 300 mA deposition from a region 1 cm away from the knot. The scale bar represents a distance of 1 µm.

Figure 7:
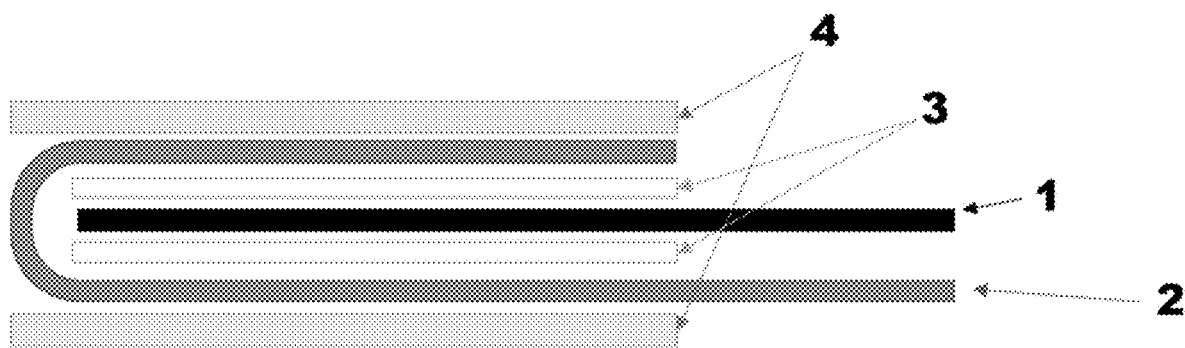
FIG. 7 is a schematic of a setup used for electroplating after the deposition of seeds through the disclosed method.

FIG. 7 is the setup used for electroplating after the deposition of seeds through the method described in this invention. The seeded carbon article (1) acts as a cathode in the electrochemical cell. The copper foil anode (2) surrounds the cathode, separated by a piece of filter paper (3). The entire setup is compressed between two glass slides (4), and then submerged into an electrolyte bath where current is applied between (1) and (2) to induce electroplating.

Figure 8:
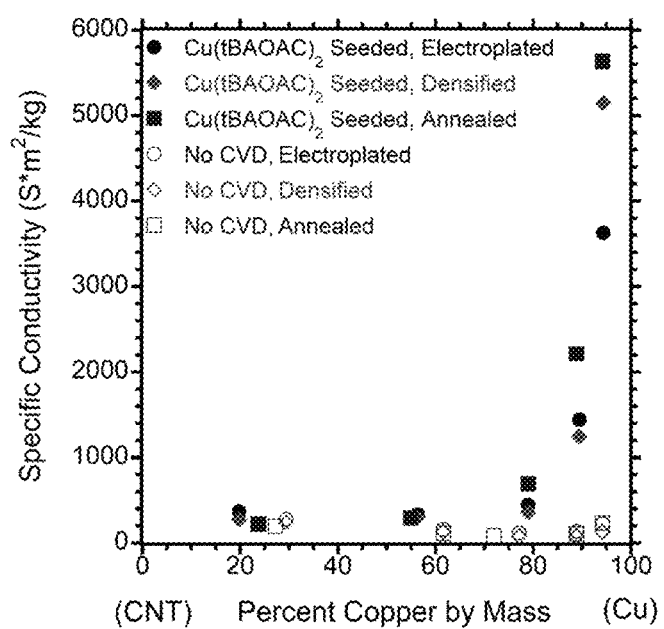
FIG. 8 is a plot of specific conductivity for electroplated, densified, and annealed conductors both with and without CVD seeding.

FIG. 8 is a plot of specific conductivity for electroplated, densified, and annealed conductors both with and without CVD seeding through the method described in this invention.

Figure 9A:
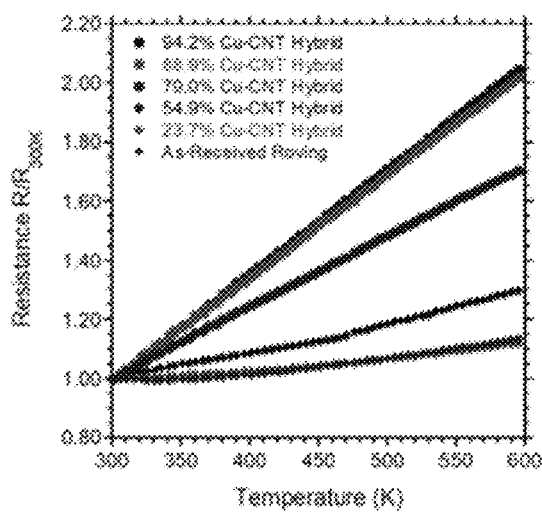
FIG. 9A is a plot of the temperature dependent electrical resistance characteristics of Cu-CNT hybrid conductors and the as-received CNT roving and FIG. 9B is a plot of the TCR and specific conductivity of Cu-CNT hybrid conductors compared to copper, CNT roving, and calculated combinations of the two materials as parallel resistors.
Figure 9B:
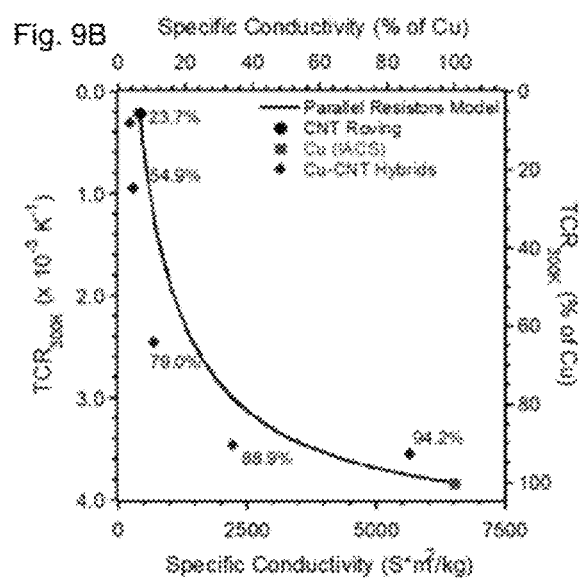

FIGS. 9A and 9B contain plots of the temperature dependent electrical resistance characteristics of this conductor. FIG. 9A is a plot of the resistance measurements (relative to 300K) under vacuum for each of the finished Cu-CNT hybrid conductors and the as-received CNT roving. The temperature coefficient of resistance (TCR) is determined from the average slope of resistance relative to 300 K. FIG. 9B is a plot of the TCR and specific conductivity of Cu-CNT hybrid conductors compared to copper, CNT roving, and calculated combinations of the two materials as parallel resistors.

Figure 10:
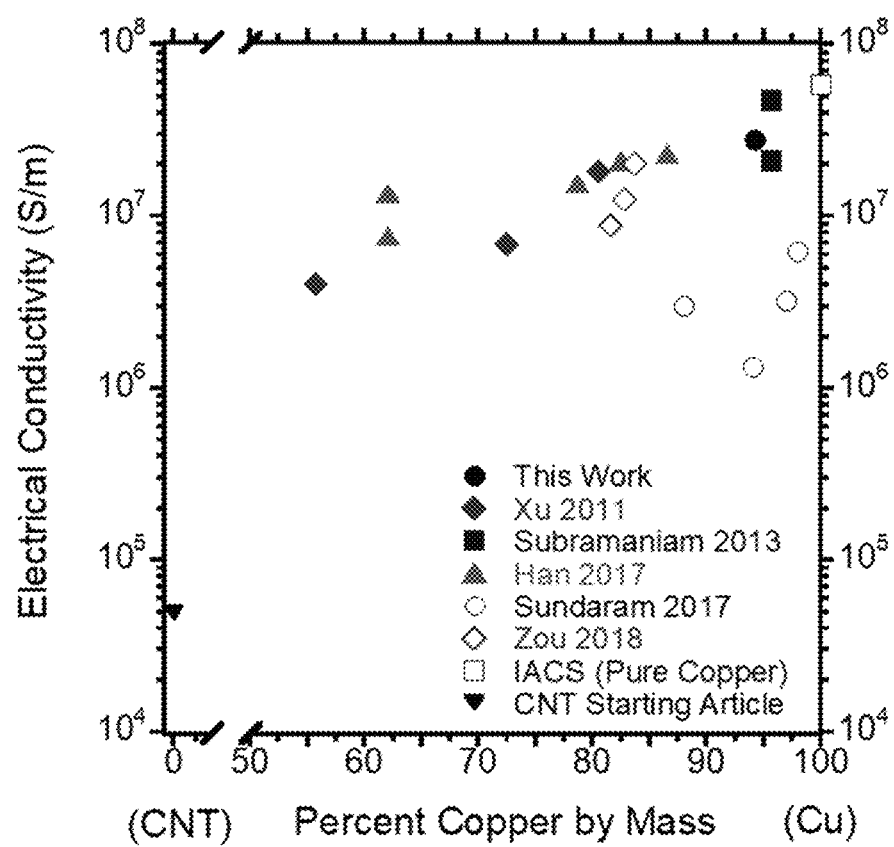
FIG. 10 is a plot of the electrical conductivity of a 94.2% Cu composite produced through nanometal deposition of Cu(tBAOAC)$_2$ followed by copper electrodeposition, densification, and annealing compared with prior art results.

FIG. 10 is a plot of the electrical conductivity of a 94.2% Cu composite produced through nanometal deposition of Cu(tBAOAC)$_2$ followed by copper electrodeposition, densification, and annealing compared with the starting CNT article, copper wire, and other recent literature results: Xu, G.; et al. *Nanoscale* 2011, 3 (10), 4215-4219. Subramaniam, C.; et al. *Nat. Commun.* 2013, 4, 1-7. Han, B.; et al. *Carbon* 2017, 123, 593-604. Sundaram, R.; et al. *Sci. Rep.* 2017, 7 (1), 9267. Zou, J.; et al. *ACS Appl. Mater. Interfaces* 2018, 10 (9), 8197-8204.

FIG. 11A is a plot of deposited mass (as linear density) comparing the active and static vacuum techniques. FIG. 11B is a secondary electron image magnified 30,000× of a one-hour active vacuum deposition at 300 mA current. The scale bar represents a distance of 1 µm. FIG. 11C is a secondary electron image magnified 30,000× of a two-hour active vacuum deposition at 300 mA current. The scale bar represents a distance of 1 µm.

Figure 12A:
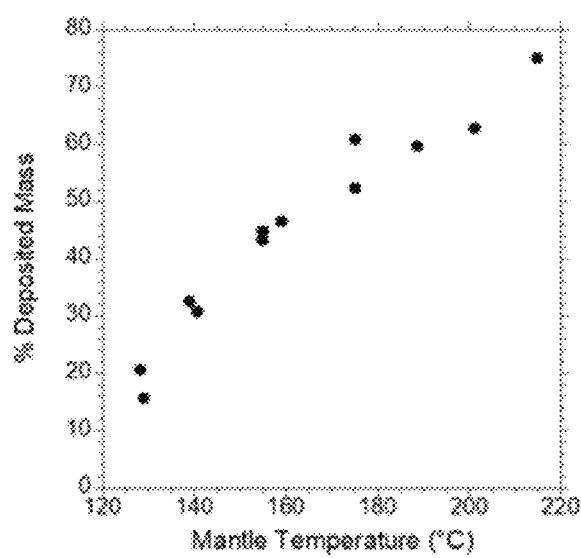
FIG. 12A is a plot demonstrating increasing deposited mass with increasing mantle temperature and FIG. 12B is a plot demonstrating a general trend in decreasing resistance per length with increasing mantle temperature.
Figure 12B:
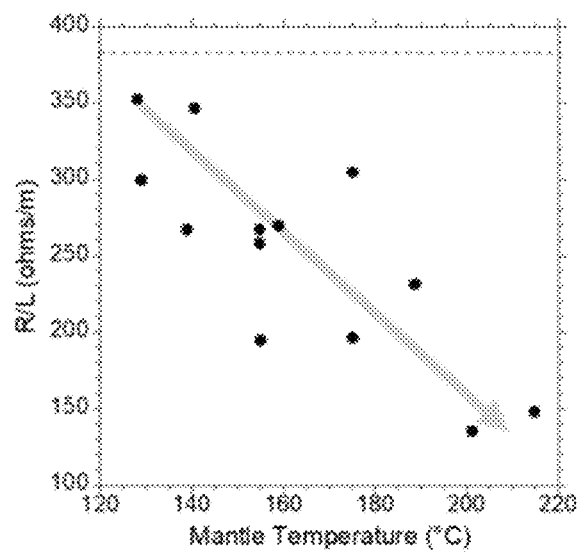

FIGS. 12A and 12B are plots of depositions of Cu(acac)$_2$ through the method described with increasing mantle temperature used to sublimate the precursor. FIG. 12A demonstrates increasing deposited mass from ~15% to 75% w/w of the final composite with increasing mantle temperature. FIG. 12B demonstrates a general trend in decreasing resistance per length with increasing mantle temperature.

FIGS. 13A and 13B are electron micrographs comparing Cu(acac)$_2$ deposition with continuously applied current and with current applied near the end of the run. FIG. 13A is a secondary electron image magnified 10,000× showing the particles deposited from a run with continuously applied current. The scale bar represents a distance of 3 μm. FIG. 13B is a secondary electron image magnified 10,000× showing the particles deposited from a run with current applied towards the end of the run. The scale bar represents a distance of 3 μm.

Figures 14A, 14B, 14C, 14D:
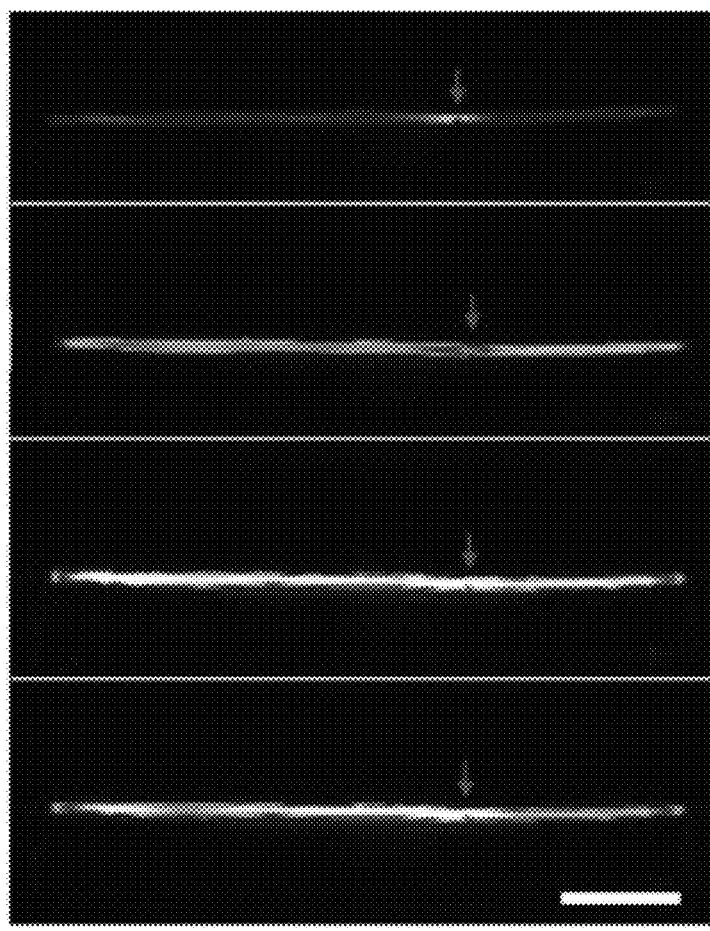
FIG. 14A is a thermal image showing peak heat spread for a 20 ms pulse.
FIG. 14B shows peak heat spread for a 100 ms pulse.
FIG. 14C shows peak heat spread for a 500 ms pulse and FIG. 14D shows peak heat spread for a 990 ms pulse.

FIGS. 14A-14D are thermal image of peak heating spread of current pulsed at 1 Hz. An intentional resistive defect has been introduced by cutting a triangular notch approximately halfway across the sample at the location indicated by the arrow. The scale bar represents a distance of 2 cm. FIG. 14A shows peak heat spread for a 20 ms pulse. FIG. 14B shows peak heat spread for a 100 ms pulse. FIG. 14C shows peak heat spread for a 500 ms pulse. FIG. 14D shows peak heat spread for a 990 ms pulse.

Figure 15A:
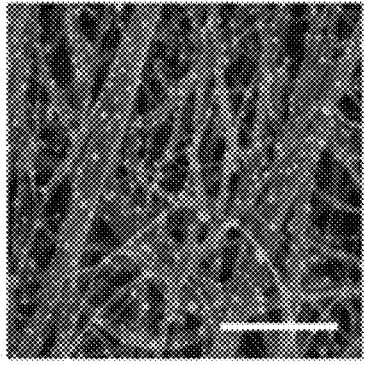
FIG. 15A is an electron micrograph image of deposition from Cu(tBAOAC)$_2$.
Figure 15B:
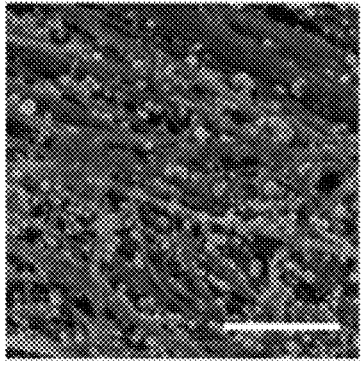
FIG. 15B is a deposition from Cu(acac)$_2$.
Figure 15C:
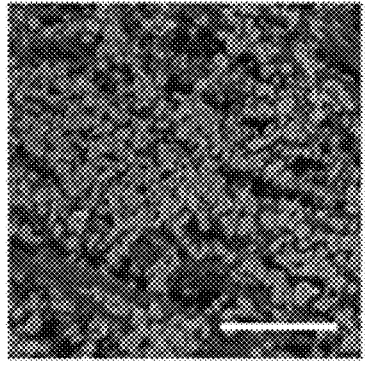
FIG. 15C is a deposition from Pd(acac)$_2$.
Figure 15D:
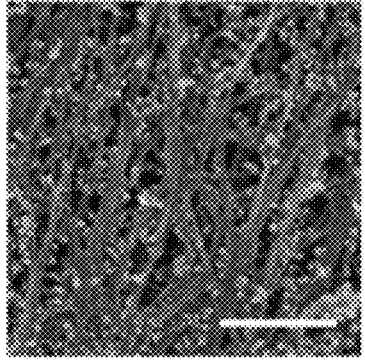
FIG. 15D is a deposition from Ni(acac)$_2$.
Figure 15E:
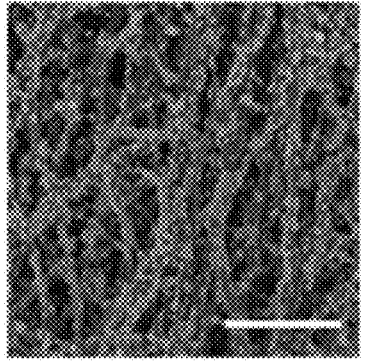
FIG. 15E is a deposition from Pt(acac)$_2$.
Figure 15F:
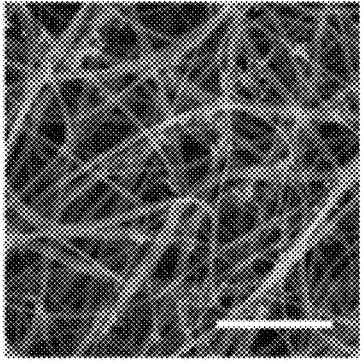
FIG. 15F is a deposition from Ag(acac)

FIGS. 15A-15F are secondary electron images magnified 60,000× of alternative metals and precursors deposited via the technique described in this invention. The scale bars represent a distance of 500 nm. FIG. 15A is a deposition from Cu(tBAOAC)$_2$. FIG. 15B is a deposition from Cu(acac)$_2$. FIG. 15C is a deposition from Pd(acac)$_2$. FIG. 15D is a deposition from Ni(acac)$_2$. FIG. 15E is a deposition from Pt(acac)$_2$. FIG. 15F is a deposition from Ag(acac).

FIGS. 16 A-16D show the results of a sequential deposition from Pt(acac)$_2$ followed by Cu(tBAOAC)$_2$. FIG. 16A is an image of the carbon article after Pt(acac)$_2$ deposition showing heavier deposits at some sites. FIG. 16B is an image of the carbon article after the sequential Cu(tBAOAC)$_2$ deposition showing heavier deposits at similar sites to FIG. 16A. FIG. 16C is a secondary electron image magnified 100,000× after the Pt(acac)$_2$ deposition. The scale bar represents a distance of 300 nm. FIG. 16D is a secondary electron image magnified 100,000× after the sequential Cu(tBAOAC)$_2$ deposition. The scale bar represents a distance of 300 nm.

Figure 17:
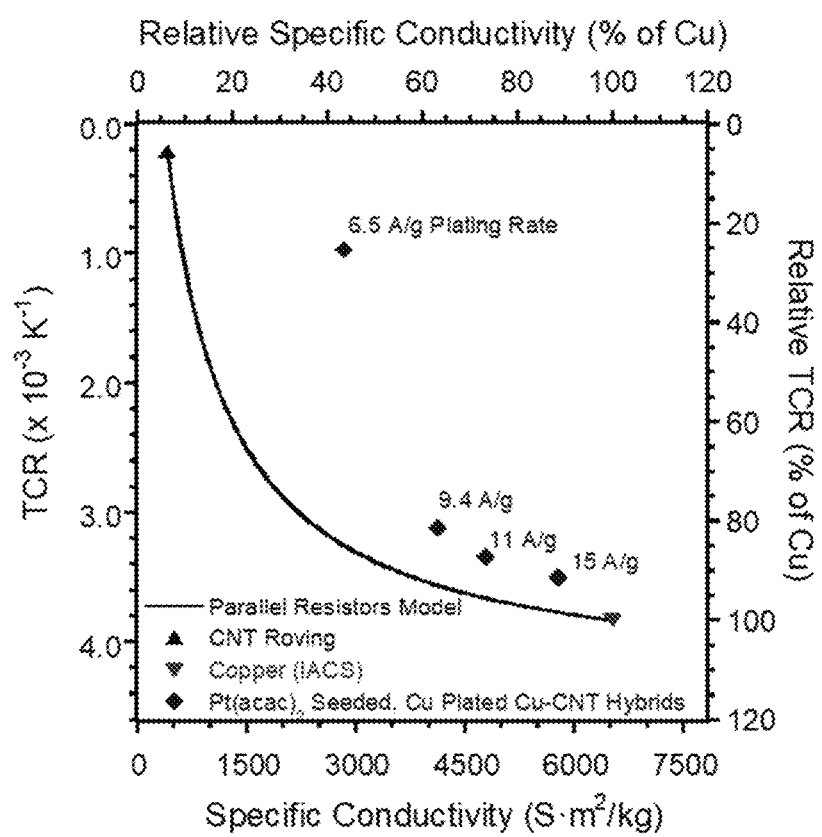
FIG. 17 is a plot of the specific conductivity and temperature coefficient of resistance of carbon articles seeded with Pt(acac)$_2$.

FIG. 17 is a plot of the specific conductivity and temperature coefficient of resistance of carbon articles seeded with Pt(acac)$_2$ via the method described by this invention with copper overcoats deposited via electrodeposition. The data was taken after densification and annealing of the samples. The rate of electroplating is presented next to each point on the chart, demonstrating a mechanism for control over the temperature dependent properties of conductors produced through this method.

Example 1

The CVD-produced electrical conductor may be used in the place of traditional metal conductors for wiring applications. It may be used in various applications to provide savings of mass or energy, especially where elevated temperatures are required. The device consists of a fibrous, conductive carbon nanotube backbone combined with conductive metal nanoparticles and/or plating (cladding) where at least part of the metallic portion has been deposited through a chemical vapor deposition (CVD) process. The highly conductive nanocarbon backbone with low temperature coefficient of resistance (TCR), can be augmented with the metals to create a hybrid conductor which has enhanced conductivity at elevated temperatures compared to conventional metals.

The carbon nanotube backbone may be a commercially produced carbon conductor, or a conductor extruded from locally produced carbon nanotubes. The individual carbon nanotubes used to produce the demonstrated conductive conductor may be either single- or multi-walled. One source is 10 tex carbon nanotube roving from Nanocomp Technologies Inc., however the process used to produce the composite conductor is amenable to a wide variety of carbon nanotube conductor products. The carbon conductor can be treated with chemical dopants and electroless plating agents prior to CVD to functionalize the localized surface and impact the thermal transport properties. Also, additives like titanium carbide can be used to enhance the adhesion properties of the deposited metal.

The amount of deposited metal from the CVD process may vary from less than 1% of the final conductor mass to over 90% of the final conductor mass. The metal may be deposited uniformly onto the CNT conductor or targeted to specific higher resistance areas of the conductor through control of the externally applied current. The CVD process may be used to deposit metal throughout the entire depth of the CNT conductor.

Various other techniques may be used to deposit additional metal onto the sample including electroplating, thermal evaporation, and/or physical vapor deposition. These techniques may be used to produce a metal overcoat or cladding onto the surface of the wire. The connection between this overcoat and the underlying conductor in enhanced through the CVD deposited metal, producing higher conductivity composites than any of these techniques alone.

Various post processing techniques may also be applied to the wire. Radial or planar densification may be used to adjust the density or improve the interconnectedness of the metal particles with the CNTs. Annealing may be used to improve the conductivity and interconnectedness of the wire. The annealing may be carried out under an inert gas such as $N_2$ or Ar, a reducing gas such as $H_2$, or some combination thereof.

The following describes the processing of Cu-CNT hybrid produced through the CVD of bis(t-butylacetoacetato) copper [Cu(tBAOAC)$_2$] followed by an electrodeposited overcoating. The carbon nanotube wire used in this study is Miralon® roving from Nanocomp Technologies Inc. The roving is ribbonlike in form, with approximate dimensions of 30 μm×1.7 mm and an average mass per length of 8.66 mg/m. It consists of a loose network of CNT bundles with an average density of 0.12 g/cm$^3$, and can be produced on the kilometer scale. This material is vacuum dried in an oven at 100° C. for at least one hour prior to further processing.

This setup is outlined in FIG. 1. The conductor chosen was an unspun CNT Miralon® roving material from Nanocomp Technologies Inc. The roving is ribbon-like in form, with approximate dimensions of 30 μm×1.8 mm and an average mass per length of 8.66 mg/m. It consists of a loose network of CNT bundles with an average density of 0.12 g/cm$^3$. The CNT roving is vacuum dried in an oven at 100° C. for at least one hour prior to CVD or characterization.

Thermogravimetric analysis establishes decomposition temperatures higher than 600° C. and 15.4% residual ash. Raman spectroscopy data demonstrates a D/G ratio of 0.059, a G'/G ratio of 0.230, and a G'/D ratio of 3.89, indicating high purity CNTs.

The CNT roving material was chosen due to its high porosity, which allows for greater penetration by the CVD precursor. The CNT roving is connected between two copper clips acting as electrical leads and suspended across the center of the flask above the CVD precursor. A 10-12 cm length of roving is chosen so that it remains suspended and does not contact any of the walls of the flask. The Cu(tBAOAC)$_2$ precursor (CAS #23670-45-3, 99%, Strem) is heated to a vapor by a mantle at the bottom of the flask. The entire flask is wrapped in glass wool to encourage more even heating. An electrical bias applied to the CNT roving promotes current flow which induces Joule heating, providing the thermal energy necessary to locally decompose the vapor precursor for deposition. The attachment of the flask to a Schlenk line allows for control over the local deposition environment within the flask, allowing for the application of vacuum or a reducing gas (5 mol % H$_2$/95 mol % Ar).

Initial tests were carried out to measure the effect of applied current on the CNT roving temperature. An electrical bias was applied to the roving in air, and temperature measurements were determined with a FLIR A35 thermal camera, corrected for the measured CNT emissivity of 0.825 determined through ASTM E1933. The average temperature of the roving was determined from a line scan along the centerline of the roving. Average temperatures of 50° C. at 100 mA, 130° C. at 200 mA, 223° C. at 300 mA, and 330° C. at 400 mA are observed. At an applied current above 400 mA (a current density of ~7.4×10$^6$ A/m$^2$), samples were not consistently stable and could undergo failure over time. Under vacuum, it is expected that the roving reaches somewhat higher temperature than those measured here, due to the lack of convective cooling. The decomposition of the Cu(tBAOAC)$_2$ precursor is reported at 225° C., therefore, electrical bias conditions between 200-300 mA are expected to provide peak temperatures sufficient to cause deposition of the precursor to copper metal.

The effects of the electrical bias applied to the CNT roving during CVD are evaluated based upon the mass deposited and the nanoscale morphology analyzed via scanning electron microscopy (SEM). A scanning electron micrograph of the as-received CNT roving, prior to exposure to precursor is shown in FIG. 4A CNT bundles of various sizes (with diameters up to 100 nm) are present, typically oriented along the axis of the CNT roving. An initial control sample with a heated mantle to evaporate the precursor, but no electrical bias through the roving during precursor exposure was prepared. The linear mass density of the roving increased by an average of 68.4%, indicating the condensation of the Cu(tBAOAC)$_2$ precursor onto the cooler roving. The electron micrograph for the sample without bias FIG. 4B, exhibits unreacted precursor as a film on its surface, however, no nanoparticle formation. Strands of roving were subsequently biased at currents of 100 mA, 200 mA, 300 mA, and 400 mA over the course of a one-hour CFH-CVD. In the standard continuous filament heating CVD (CFH-CVD) process, the flask is sequentially evacuated under vacuum then purged with 5% H$_2$/95% Ar four times. The flask is then evacuated for at least ten minutes prior to the deposition to reach a pressure of 166 mBar, after which the stopcock is closed. A constant electrical bias of 100, 200, 300 or 400 mA is applied to the roving to induce Joule heating, and the flask is heated using a heating mantle to a set temperature of 155° C. over the period of 10 minutes to begin the evaporation of the Cu(tBAOAC)$_2$. As the flask heats, vacuum is applied every 20° C. to ensure the low pressure is maintained within the flask until the deposition starts. The Cu(tBAOAC)$_2$ precursor typically evaporates from a liquid phase (melting at a mantle temperature of ~150° C.) rather than sublimating from its solid state. The CVD setup is maintained at the set temperature for a period of one hour to allow the deposition to occur. After the deposition has occurred, the heating mantle is removed, and the flask is purged with 5% H$_2$/95% Ar. After allowing the flask to cool for five minutes, the electrical bias is removed and the vapor-deposited roving is removed for characterization. Sample surface morphology was evaluated via a Hitachi S900 SEM equipped with an immersion lens and backscatter electron detector. Secondary electron images were taken at 2 keV and backscatter electron images were taken at 10 keV. At 100 mA, FIG. 4C, irregularly-shaped nodules of incompletely decomposed precursor are observed at various locations across the surface of the roving. At 200 mA, sparse nanoscale spherules are evident at various locations across the surface of the sample, as seen in FIG. 4D. At 300 mA (see FIG. 4E), an increase in the number of particles is noted at locations in which they were observed. As FIG. 4F shows, at 400 mA spherules are observed across the majority of the segments analyzed. Overall, between 200 mA and 400 mA for a one-hour deposition, the evolution from sparse collections of particles to more dense and uniform deposition of 10-40 nm particles is observed as the CNT roving's temperature exceeds the threshold current, with an average increase in linear density of 1.58 mg/m (14.85% of the hybrid mass).

Studies into deposition time at a constant current of 300 mA reveal a saturation-type effect on the deposited mass in this CHF-CVD setup. In a half-hour deposition at 300 mA, an average mass increase of 8.42% is measured. Beyond this, all deposition times from 1 to 2 hours lead to comparable average deposited masses of 14-15% of the composite mass. The saturation of the vapor in the reaction vessel may be self-limiting the deposition due to the gaseous decomposition byproducts of Cu(tBAOAC)$_2$, preventing further evaporation of the precursor.

A sample biased at 400 mA with a one-hour CHF-CVD was used as an archetypal example for further chemical and physical analysis. Under backscatter electron (BSE) imaging, high contrast was observed between the deposited spherules and the underlying CNT matrix, indicating a much higher Z element is present in the spherules.

A Tescan Mira3 SEM equipped with a Bruker energy dispersive x-ray (EDX) spectrometer was used for elemental analysis of the sample surfaces. EDX confirms that the deposited spherules are copper, as is highlighted in FIG. 5. Notably, the deposition yields a seeded roving with similar resistance (375 Ω/m) to a control roving sample exposed to similarly high current (386 Ω/m). This is attributed to the fact that the deposited Cu metal exists as discretized spherules rather than a continuous film.

For cross-sectional imaging, the focused ion beam (FIB) milling, imaging and EDS were performed in a FEI scanning electron microscope (SEM)/Ga liquid metal ion source (LMIS) dual-beam tool, equipped with an Oxford Instruments X-Max 80 mm EDS x-ray detector. A CNT wire, mounted on a 45° Al stub and tilted 7° to align its surface normal with the FIB axis, was FIB cross-sectioned in three steps. A 30 keV Ga ion beam at 19 nA was used for the initial cut. Clean-up cuts were performed with an 8 keV Ga ion beam at 2.8 nA. The lower energy and ion beam current of the clean-up cuts helped to reduce damage of adjacent features and reduced the concentration of Ga near the surface. EDS mapping was performed using a 20 keV electron beam rastered over a region 2 μm×12 μm region at a tilt angle of 30° yielding an incident angle of 75°. The FIB cross-section of this sample (FIG. 5C) confirms that the deposition is present throughout the thickness of the low-density roving. Combined with a copper overcoat, this may prove useful for connecting interior areas of the sample, providing additional conductive pathways beyond those that may be achieved through a metal overcoat alone.

For comparison with the standard CHF-CVD setup, an alternate approach in a "delayed filament heating CVD" (DFH-CVD) setup. For the DFH-CVD method, no electrical bias is applied to the CNT roving during the one-hour deposition process. However, the precursor is still heated to 155° C. Due to the lack of gaseous thermal decomposition byproducts, an increased mass of Cu(tBAOAC)$_2$ is expected to condense upon the roving conductor, since the pressure within the flask should not rise above the threshold of Cu(tBAOAC)$_2$ vaporization during the deposition. After the condensation has occurred, the flask is purged with 5% H$_2$/95% Ar. A current of 400 mA is then applied to the roving to induce Joule heating and cause the decomposition of the precursor. Slightly higher deposited masses of 16.11% were obtained through the DFH-CVD method after the one-hour deposition followed by a 400 mA bias applied under 5% H$_2$/95% Ar. However, examinations of particle morphology reveal the nanoscale copper spherules noted under CHF-CVD have been replaced by larger microscale spheres of copper. The change in particle size could be caused by the adhesion of the Cu(tBAOAC)$_2$ film to itself during decomposition. Since there is limited adhesion between CNTs and metallic Cu, the precursor may ripen into larger spheres rather than locally depositing as nanoparticles. Thus, it would appear advantageous to have consistent electrical bias applied throughout the deposition process, to ensure that hot spots on the CNT roving decompose the precursor locally.

While 400 mA was able to produce a uniform deposition along the roving, 300 mA is a more stable condition to evaluate whether site selectivity is possible during deposition. Thus, CFH-CVD was also performed with a 300 mA bias on a length of roving into which a knot had been tied (FIG. 6A) to evaluate whether location-specific heating is a cause of preferential copper deposition from the vapor-phase precursor. Thermal imaging in air demonstrates that the presence of a knot in the CNT roving can generate a localized hot spot under bias, as shown in FIG. 6B.

Visual inspection establishes that the presence of hot spots can also be verified through incandescence at higher applied currents (≥450 mA) under vacuum. After the one-hour, 300 mA CFH-CVD, segments from a knotted piece of roving were characterized by SEM. Heavy amounts of deposited copper are observed at and immediately around the knots, as in FIG. 6C. At the distance of ~1 cm away from the knots, the deposition appears much lighter, as in FIG. 6D. Thus, the results indicate that metal is preferentially deposited with higher local temperature—a key potential advantage of this technology over nonspecific deposition methods such as electrodeposition or sputtering. Although the present focus demonstrates macro- to milli-scale control over depositions, closer modulation of the current may allow for the tuning of the deposition towards the nanoscale if individual CNT to CNT junctions are able to be selectively heated.

Electrodeposition of Overcoat and Finishing

A copper overcoat was electrodeposited onto samples which had undergone CFH-CVD seeding pretreatment with a bias of 300 mA to produce finished electrical conductors. In recent literature, metallic fractions of over 90% of the composite mass are common. This is primarily due to the drastic difference between the densities of copper (8.96 g/cm$^3$) and carbon nanotubes (0.12 g/cm$^3$ for roving, towards 1 g/cm$^3$ or higher in compressed wires), which leads to composites that are around 50% copper by volume. In the present work, a variety of copper mass loadings were evaluated to provide a more complete understanding of the impact of the CVD pretreatment. All electroplating was carried out against copper anodes in a sandwich-cell configuration with a plating current of 12 A/g$_{roving}$ for predetermined times between one minute and one hour (FIG. 7). In the sandwich-cell configuration, the sample was inserted within a folded piece of Whatman 42 filter paper to act as a separator. A piece of copper foil was wrapped around the filter paper to act as a counter electrode. This entire setup was sandwiched between two glass slides and secured with Kapton tape to provide compression and ensure constant distance between the CNT roving working electrode and copper counter electrode. The electrochemical cell was then submerged into a bath of acid copper electroplating solution (Transene). Electroplating was carried out under constant supplied current from an Arbin BT2000 battery tester. A constant cathodic current of 12 A/g$_{CNT\ roving}$ was applied over deposition times ranging from one minute to one hour (depending on the mass loading targeted). After electroplating, samples were rinsed with deionized water, and allowed to dry for 1 hour at 100° C. under vacuum.

Here, current is presented proportionally to the mass of the CNT roving (as A/g$_{roving}$) due to the porous, nanoscale network of the CNTs, which may lead to variation in local surface area along the length of the roving. Densification of the electroplated carbon nanotube wires was carried out in a rolling mill to produce a ribbon-like conductor. Twenty passes were made through the rolling mill, reducing the gap by 1 μm every other pass. Finally, samples were annealed under 5% H$_2$/95% Ar gas at 300° C. for 3 hours to reduce any remaining copper oxides and ensure good electrical contact between copper particles.

FIG. 8 shows a plot of the specific conductivity of samples with and without Cu(tBAOAC)$_2$ CFH-CVD as a pretreatment for electroplated CNT roving. The specific conductivity is defined as the bulk electrical conductivity normalized to sample density and provides a direct comparison of the gains made through metal incorporation and finishing. The specific conductivity value relies on measurements of resistance per length and mass per length, thus avoiding the need to measure the cross-sectional area of each sample. The equation is given by:

$$\sigma_{sp} = \frac{\sigma}{D} = \frac{\frac{L}{RA}}{\frac{M}{LA}} = \frac{L^2}{RM}$$

where $\sigma_{sp}$ is the specific conductivity, $\sigma$ is the conductivity, D is the sample density, L is the length of the conductor, R is the resistance, A is the cross-sectional area, and M is the mass. The independence from cross-sectional area accounts for any variations in density between lengths of roving, and gains made through densification and annealing can be attributed to decreases in the linear resistance of the sample. The samples were massed before and after the CVD and electroplating depositions using a Mettler Toledo XP-2U microbalance, and their lengths were measured using high-precision calipers. Electrical resistance was measured using a four-point probe connected to a National Instruments NI PXI-5652 source/measure unit and an NI PXI-4071 digital multimeter at room temperature (~20° C.) through a current-potential sweep. Room temperature specific conductivity values in FIG. 8 are presented after electroplating, after densification through calendaring, and after annealing. Below 60% mass loading, decreases in the samples' resistance were offset by increases in sample mass, leading to neutral (for CVD seeded) or negative (for non-seed) changes in specific conductivity. While decreases in resistance per length are observed (156 Ω/m at 54.9% Cu for CVD pretreated after annealing compared to 368 Ω/m for 61.2% Cu with no pretreatment after annealing), the small volume fraction of the copper overcoat is likely unable to produce a strong electrical percolation network throughout the CNT roving. Between 54.9% w/w Cu and 78.9% w/w Cu, substantial increases are observed in the specific conductivity of the CVD pretreated samples. Specific conductivity values as high as 5632 S·m$^2$/kg (with resistance per length of 1.14 Ω/m) are attained for a sample with 94.2% copper mass. However, without CVD pretreatment, there is no substantial change in the specific conductivity of the electroplated samples. At 94.1% Cu, electroplated CNT roving has resistance per length reduced to 26.0 Ω/m, yet only reaches a specific conductivity of 218 S·m$^2$/kg, substantially lower than the 407 S·m$^2$/kg starting specific conductivity of the roving. This indicates much improved utilization of the electrodeposited copper mass through the selective deposition of Cu from the Cu(tBAOAC)$_2$ precursor.

A measurement of the temperature coefficient of resistance (TCR) of the Cu(tBAOAC)$_2$ seeded Cu-CNT hybrid conductors were taken under vacuum over the range of 300K to 600K. The temperature coefficient of resistance (TCR) was measured using a four-point probe setup within a Janis cryostat connected to a National Instruments NI PXI-4110 Programmable Power Supply and an NI PXI-4072 digital multimeter through a current-potential sweep. Resistance was measured at 10$^{-6}$ mBar every 5 K over the range of 300 K to 600 K. Two cycles of temperature were measured and data from the second cycle is presented to minimize effects of temperature annealing through the first cycle. The TCR was determined from the average slope of the resistance relative to 300K. As the mass fraction of Cu increases, the TCR for the Cu-CNT hybrid conductors, measured with respect to 300K, appears to follow a much more positive (metal-like) trend than the as-received CNT roving (which has a TCR of 2.18×10$^{-4}$ K$^{-1}$), as displayed in FIG. 9A. However, even at 94.2% w/w Cu the Cu(tBAOAC)$_2$ seeded and electroplated sample's average measured TCR$_{300K}$ of 3.53×10$^{-3}$ K$^{-1}$ is still lower than the standard 3.83×10$^{-3}$ K$^{-1}$ for annealed copper. This lower TCR leads to less relative loss in conductivity at elevated temperatures.

One proposed advantage of the Cu-CNT hybrid conductor for applications at elevated temperatures is the beneficial combination of high specific conductivity at a lower TCR. Consider a limiting case in which the Cu and CNT fractions of a conductor operate as discrete, non-interacting layers. Each layer could be envisioned as carrying a portion of the current, and thus on the bulk scale the system could be modeled as parallel resistors. In such a case, the expected specific conductivity and TCR may be determined based on the mass fraction of Cu and CNTs in such a layered structure with the intrinsic values for the pure materials.

The predicted value relationship for TCR vs. room temperature specific conductivity over the continuum from 100% Cu conductor to 100% CNT roving conductor is shown in FIG. 9B. The measured values obtained for the finished Cu(tBAOAC)$_2$ seeded and electroplated samples are also shown on this graph. Between 88.9% and 94.2% w/w Cu, the Cu(tBAOAC)$_2$ seeded and electroplated hybrids "cross-over" the threshold line representing the parallel resistors model. Therefore, the 94.2% w/w CNT-Cu hybrid represents a better combination of TCR and specific conductivity than would be expected from a simple combination of its constituent materials. Thus, there is evidence that the combination of CNTs and Cu in the material presented exhibit properties of a true hybrid rather than a layered composite.

Mechanical properties for a 94.2% w/w Cu-CNT hybrid have also been evaluated. The tensile strength of 92 MPa and Young's modulus of 11.6 GPa fall in between values obtained from the as-received roving (58 MPa tensile strength, 2.75 GPa Young's modulus) and a 12 μm copper foil with similar linear mass density and width to the sample (225 MPa tensile strength, 40.9 GPa Young's modulus).

A cyclic bending test was carried out by wrapping the samples around a 4.5 mm diameter glass rod mounted at an angle ~12° from the perpendicular to the sample. Each end of the sample was attached to a movable stage with adhesive tape. By translating the stage along the sample's length, the entire length of the sample was made to bend around the glass rod and then re-straighten. The results demonstrate that the annealed 94.2% w/w Cu-CNT hybrid exhibits less than 3% increase in resistance over 1000 bend cycles, consistent with properties for 12 μm Cu foil. Results from a 12 μm thick piece of copper foil with similar mass per length (~160 mg/m) and width (1.71 mm) to the Cu-CNT hybrid is presented for comparison.

The conductivity of the 94.2% w/w Cu-CNT hybrid sample was determined by measuring the width of the sample via optical microscopy and thickness via SEM The cross sectional area was determined to be 3.04×10$^{-8}$ m$^2$ at the cut section of the Cu-CNT hybrid, resulting in a room temperature electrical conductivity of 2.81×10$^7$ S/m.

FIG. 10 compares the present work to other recently published Cu-CNT hybrid conductors, where the electrical conductivity result from the combination of CFH-CVD with aqueous electrodeposition is among the highest reported at this mass loading of copper. This is particularly notable in that a low density (0.12 g/cm$^3$) (and high void space) starting material with an electrical conductivity at room temperature of only 4.94×10$^4$ S/m was enhanced by 569 times the original electrical conductivity. Thus, the CVD and electroplating technique is expected to be adaptable to various quality CNT conductor starting materials. Furthermore, the measured composite density of 5.14 g/cm$^3$ is only 61.4% of the calculated value for a sample consisting of 5.8% CNT roving and 94.2% Cu by mass based on a rule-of-mixtures. Optimizing this conductor density through improved densification techniques may yield further gains even without major process modifications. Overall, the CVD process is a demonstrated technique to selectively deposit nanometal Cu seeds onto CNT roving for enhanced electroplating utilization leading to hybrid structures with high electrical conductivity.

The site-selective CVD of nanometal copper from Cu(tBAOAC)$_2$ has been demonstrated as an effective pretreatment method for the production of high conductivity copper-CNT hybrid conductors. Using Joule heating of a CNT conductor to drive the CVD process is a robust, tunable, and scalable method towards more efficient use of metal mass within hybrid bulk conductors. The combination of CVD with conventional electroplating techniques outperforms standard electroplating over a wide range of mass loadings. Copper-CNT hybrids with room temperature specific conductivities of 5632 S·m$^2$/kg and electrical conductivities of 2.81×10$^7$ S/m have been demonstrated with this approach. These results represent increases of 13.8× and 569× the as-received CNT roving's specific conductivity (407 S·m$^2$/kg) and conductivity (4.94×10$^4$ S/m), respectively. Further tuning of the nanometal seed mass and distribution through adjustment of the deposition parameters may produce even better utilization of added Cu mass. The CVD process also can be adapted to a wide variety of precursors using various metals and presents a significant opportunity for advancing the field of metal-CNT hybrid conductors. Certain metals, such as platinum, palladium, or nickel which have improved bonding interactions towards carbon nanotubes may prove to be even better candidates for such vapor deposited seeds. The utility of this method lies in the fact that the CVD-produced seeds are uniquely deposited in localized regions due to the temperature differences (from the localized resistance) which contrasts with previous electroplating work where seed deposition is non-specific. While this paper has demonstrated macro- to micro-scale control over depositions, further selectivity towards the nanoscale could potentially be obtained through the application of a pulsed current through the CNT substrate that would modify the localized heating. Additionally, the process timescale for CVD seeding can be minutes to hours rather than hours to days for previous electroplating seed procedures. Thus, the described approach represents an emerging strategy to fabricate various metal-CNT hybrid conductors with enhanced temperate-dependent electrical properties for applications like rotating machinery and electric motors.

Example 2

In the initial study, a constant seed mass of 14-15% w/w was deposited in each of the final samples. However, this is not necessarily the ideal seed density for the final conductor. To determine whether higher seed masses may be deposited, an "active-vacuum" setup was evaluated (FIG. 11). In this modification to the deposition process the vacuum line was left open in the system, instead of closed as in the previous "static-vacuum" technique. This will allow for any reaction byproduct gasses to be removed from the system, thereby lowering the pressure and allowing for further vaporization and decomposition of the precursor. This "active vacuum" setup led an increase in the deposited mass to 33.38% from the previous 14.78% in the "static vacuum" setup with a one-hour deposition time from 50 mg of $Cu(tBAOAC)_2$ precursor.

In this setup, higher masses are also obtainable from increased deposition time, as shown in FIG. 11A. Going from a one-hour deposition (FIG. 11B) to a two-hour deposition (FIG. 11C), the deposited nanoparticles can be seen to completely cover the surface of the CNT roving.

While $Cu(tBAOAC)_2$ is a good choice for the seeding metal due to the small seed size deposited, it is not the only precursor available. Recent studies with a copper (II) acetylacetonate $[Cu(acac)_2]$ precursor have demonstrated the ability for the precursor to deposit heavier masses than the $Cu(tBAOAC)_2$ precursor through a one-hour active vacuum CFH-CVD process. In previous studies, variation of deposition time was evaluated to obtain control over deposited mass. In recent studies, improved control over the deposited seed mass from the acetylacetonate precursors was achieved by altering the mantle temperature of the vapor deposition setup. Varying mantle temperature changes the sublimation rate of the precursors, leading to different deposited masses over the course of a one-hour active-vacuum CFH-CVD. FIG. 12A illustrates that increasing deposited seed masses are obtained from $Cu(acac)_2$ with increasing mantle temperatures from 130° C. to 215° C. FIG. 12B generally shows decreasing resistance/length with increasing seed mass over this range.

Conversely, much lower deposited masses may be obtained from a one-hour static vacuum DFH-CVD with a mantle temperature of 200° C. of the same $Cu(acac)_2$ precursor. An average deposited seed mass of 14.8% w/w was obtained through this method, compared to 74.7% w/w through active vacuum CFH-CVD. Contrary to the results of the $Cu(tBAOAC)_2$ precursor, the $Cu(acac)_2$ is able to maintain smaller nanoparticle deposition in the DFH-CVD process, as seen in FIG. 13.

A final consideration is whether the system becomes exhausted of precursor prior to the end of the deposition in an active vacuum setup. Thus, the added precursor mass may play a role in the mass of seed deposited. Conditions such as lower vacuum (higher pressure), shorter reaction times, lower mantle (precursor) temperature, DFH-CVD, and the use of lower precursor mass are expected to lower the deposited mass form the process. Conditions such as higher vacuum (lower pressure), longer reaction times, higher mantle (precursor) temperature, CFH-CVD, and the use of higher precursor mass are expected to lower the deposited mass form the process.

An additional CVD process modification that was investigated is the use of a pulsed-filament heating CVD (PFH-CVD) process. While the previous work demonstrated the ability achieve site selectivity on a micro- to macro-scale, ultimately seeds would achieve the most benefit from deposition at junctions between individual CNTs and between bundles of CNTs. The use of a current pulse to heat the roving allows for improved localization of the heating. In an initial study into the effect of current modulation on heat localization, A triangular notch was cut halfway through a strand of roving to create a defect in the strand. A pulsed current was then applied to the roving, and the resultant heating was measured in air using a FLIR A35 thermal camera. Current pulses with lengths of 20 ms, 100 ms, 500 ms, and 990 ms were applied at 1 Hz frequency. As can be seen in FIG. 14, the hottest point in the roving is centered on the defect, particularly in the shorter pulses. However, as the pulse length increases to 500 ms, the peak spread of the heat across the roving increases until the entire roving is hot. Thus, short pulses of current may represent one path towards more efficient utilization of deposited metal mass.

Example 3

Figure 15G:
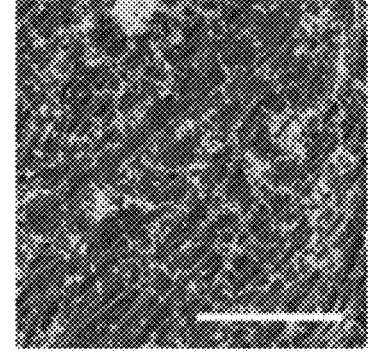
FIG. 15G is an electron image deposition from Ir(acac)$_3$.
Figure 15H:
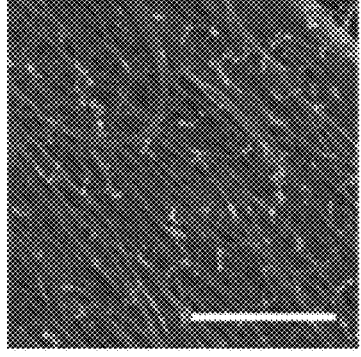
FIG. 15H is an electron image deposition from Rh(acac)$_3$.
Figure 15I:
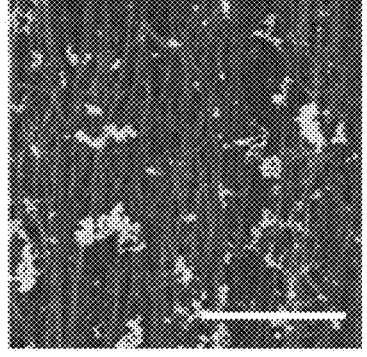
FIG. 15I is an electron image deposition from Ru(acac)$_3$.

The process is versatile in the types metal that may be deposited by varying the starting precursor. A test was conducted in which the roving was not electrically biased during the deposition time (DFH-CVD). Nickel (II) acetylacetonate $[Ni(acac)_2]$, platinum (II) acetylacetonate $[Pt(acac)_2]$, palladium (II) acetylacetonate $[Pt(acac)_2]$, silver (I) acetylacectonate, iridium acetylacectonate $[Ir(acac)_3]$, rhodium acetylacectonate $[Rh(acac)_3]$, and ruthenium acetylacetonate $[Ru(acac)_3]$ were evaluated in addition to the $Cu(acac)_2$ and $Cu(tBAOAC)_2$. At the end of the deposition, the heat was turned off and 5% $H_2$/95% Ar was pumped into the flask. The roving was then electrically biased at 350-400 mA for 5 minutes. Fumes were noted as briefly evolving from the roving when the electrical bias was applied, indicating decomposition of the precursors. The amount deposited dropped to 7.2% of the composite mass from the $Cu(acac)_2$ precursor. The $Ni(acac)_2$ deposition led to a composite with 23.4% deposited mass, the $Pt(acac)_2$ led to a deposition with 31.0% deposited mass, the $Pd(acac)_2$ led to a deposition with 8.0% deposited mass, and the Ag(acac) led to 12.1% deposited mass. It was observed under SEM that the group 10 elements all have much more irregularly shaped deposits compared to $Cu(acac)_2$ (FIG. 15B). The Ni appeared to form ellipsoids (FIG. 15D), while the Pd formed irregular pancake shapes (FIG. 15C). The platinum formed the smallest particles, clustered tightly along the length of the nanotubes (FIG. 15E). These irregular shaped deposits suggest improved interaction between the CNTs and the deposited metals compared to copper. The Ag led to sporadic deposits of nanoparticles (FIG. 15F). Ir (FIG. 15G), Rh (FIG. 15H), and Ru (FIG. 15I) all tended to form nanoparticles at lower mass loadings (<25% w/w) and coatings at higher mass loadings (<25% w/w). The combination of these precursors with the CFD method provides a pathway towards the deposition of seeding or wetting layers onto which a highly conductive copper overcoat can be applied.

Figure 16A:
FIG. 16A is an image of the carbon article after Pt(acac)$_2$ deposition.
Figure 16B:
FIG. 16B is an image of the carbon article after the sequential Cu(tBAOAC)$_2$ deposition.
Figure 16C:
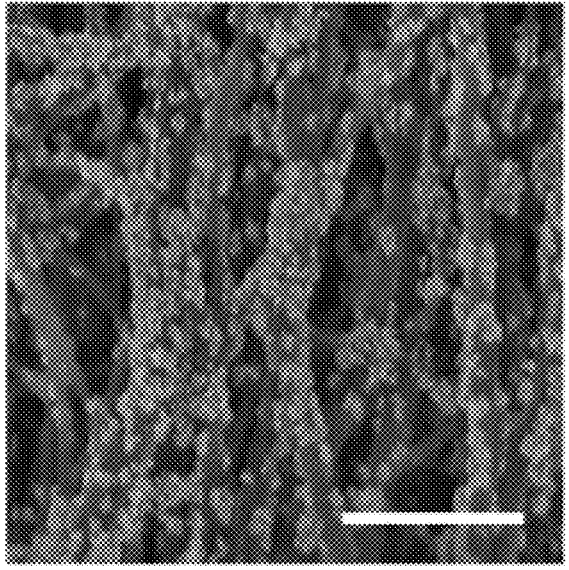
FIG. 16C is an electron image after the Pt(acac)$_2$ deposition and FIG. 16D is an electron image magnified after the sequential Cu(tBAOAC)$_2$ deposition.
Figure 16D:
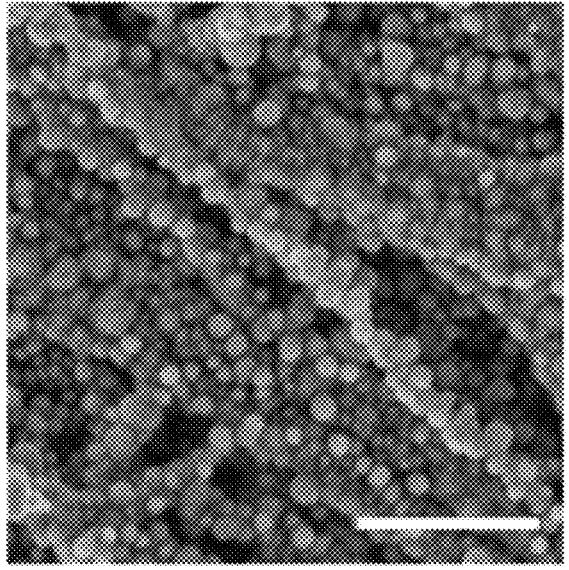

In a follow-up experiment at RIT, a Pt(acac)$_2$ DFH-CVD roving (FIG. 16A, FIG. 16C) was sequentially deposited with Cu(tBAOAC)$_2$ under the CFH-CVD deposition process (FIG. 16B). In this sample, there did appear to be better adhesion of the Cu to the underlying CNT network after the Pt(acac)$_2$ seeding, as evidenced by the smoothing out of the Cu visible in FIG. 16D.

In a second example utilizing a Pt(acac)$_2$ DFH-CVD combined with an electroplated copper overcoating, it was found that in conductors with ~94.5% total metal mass exhibited combinations of specific conductivity and temperature coefficients of resistance far better than would be expected from the parallel resistors model. A one-hour DFH-CVD of Pt(acac)$_2$ was carried out to deposit an average of 30.1% w/w seed metal. The seeded samples were then electroplated using a Transene acid copper solution in a sandwich cell, targeting ~94.5% total metal mass. Approximate plating rates (per gram of CNT) of 6.5 A/g, 9.4 A/g, 11 A/g and 15 A/g were used (equating to applied cathodic currents of 5 mA, 6.7 mA, 7.5 mA, and 10 mA). It was found that the deposition rate (measured based on the starting mass of the CNT article in A/g), could be used to modify the combination of specific conductivity and TCR$_{300K}$ achieved, as shown in FIG. 17. TCR$_{300K}$ as low as $0.97 \times 10^{-3}$ K$^{-1}$ was obtained from the slowest plating rate. A specific conductivity as high as 5772 S·m$^2$/kg was observed for the fastest plating rate. The 11 A/g plating rate led to a conductivity of 31.3 MS/m, comparable to that of many metals. Thus, the versatility of this technique towards depositions of a wide variety of metals allows for the tuning of specific properties of the articles produced through the method described in this invention.

Although various embodiments have been depicted and described in detail herein, it will be apparent to those skilled in the relevant art that various modifications, additions, substitutions, and the like can be made without departing from the spirit of the disclosure and these are therefore considered to be within the scope of the disclosure as defined in the claims which follow.

What is claimed:

1. A method for making a bulk nanotube-based electrical conductor, comprising:
   providing a free-standing three-dimensional article comprising porous electrically conductive carbon nanotube material;
   distributing a vapor-phase organo-metallic precursor throughout the porous volume of the article;
   applying electrical energy to the article to thermally decompose the precursor and deposit a first metal from the organo-metallic precursor throughout the article providing an electrical interface between a surface of the article and a subsequently deposited second metal; and
   depositing a second metal onto the article to form a bulk nanotube-based electrical conductor.

2. The method of claim 1, wherein the deposited first metal comprises nanoparticles or coatings.

3. The method of claim 1, wherein the deposition of the first metal is controlled via localized differences in temperature of the article.

4. The method of claim 1, wherein the applied energy comprises site-specific heating from direct current electrical bias, alternating current electrical bias, radiative heating from a laser source, infrared heating, inductive heating, conductive heating, or combination thereof.

5. The method of claim 4, wherein the site-specific heating increases the local temperature of the article to a temperature greater than or equal to the decomposition temperature of the vapor-phase organo-metallic precursor.

6. The method of claim 5, wherein the temperature is between 100° C. and 1100° C.

7. The method of claim 4, wherein the site-specific heating is provided in a continuous, delayed, pulsed or combination thereof.

8. The method of claim 1, wherein the article comprises a length of at least 1 cm and is composed of single wall carbon nanotubes, multi-walled carbon nanotubes, or combinations thereof.

9. The method of claim 1, wherein the vapor-phase organo-metallic precursor comprises a metalorganic compound, inorganic hydride, or metal carbonyl.

10. The method of claim 2, wherein the nanoparticles and coatings are comprised of Cu, Ag, Au, Ni, Pd, Pt, Fe, Ru, Co, Rh, Ir, W, Cr, Mo, Mn, Zn, Pb, Ti, V, Zr alloys thereof, oxides, an intermetallic, or a solid solution thereof.

11. The method of claim 2, wherein the nanoparticles and coatings comprise silicon, germanium, tin or alloys thereof.

12. The method of claim 1, further comprising simultaneously or sequentially thermally decomposing additional chemical precursors.

13. The method of claim 1, further comprising post-processing of the article through annealing, densification, electrodeposition, and combinations thereof, to fabricate a composite or hybrid comprising the article.

14. The method of claim 1, wherein the article mass comprises up to 99.9% w/w of the deposited first metal.

15. The method of claim 1, wherein thermally decomposing the precursor comprises controlling a composition of the reaction environment through the addition of air, Ar, He, $H_2$, $N_2$, $O_2$ $NH_3$, CO gasses, or combinations thereof.

16. The method of claim 15, wherein the reaction environment is controlled to remove gasses or reaction byproducts from the decomposed precursor to modify the deposition.

17. The method of claim 1, wherein the deposition of the second metal comprises CVD, physical vapor deposition, electroless deposition or electroplating.

18. The method of claim 17, wherein depositing the first metal comprises modifying optical, electrical or magnetic properties of the article at site-specific locations prior to the deposition.

* * * * *